(12) United States Patent
Park et al.

(10) Patent No.: US 10,707,231 B2
(45) Date of Patent: Jul. 7, 2020

(54) SEMICONDUCTOR MEMORY DEVICE HAVING VERTICAL SUPPORTER PENETRATING THE GATE STACK STRUCTURE AND THROUGH DIELECTRIC PATTERN

(71) Applicant: Samsung Electronics Co., Ltd., Suwon-si (KR)

(72) Inventors: Kyeong Jin Park, Yongin-si (KR); Seo-Goo Kang, Seoul (KR); Kwonsoon Jo, Suwon-si (KR); Kohji Kanamori, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 34 days.

(21) Appl. No.: 16/193,283

(22) Filed: Nov. 16, 2018

(65) Prior Publication Data
US 2019/0312051 A1    Oct. 10, 2019

(30) Foreign Application Priority Data
Apr. 6, 2018 (KR) .................. 10-2018-0040088

(51) Int. Cl.
| | | |
|---|---|---|
| H01L 27/11582 | (2017.01) | |
| H01L 27/11573 | (2017.01) | |
| H01L 23/48 | (2006.01) | |
| H01L 27/11568 | (2017.01) | |
| H01L 23/528 | (2006.01) | |
| H01L 23/522 | (2006.01) | |
| H01L 29/10 | (2006.01) | |

(52) U.S. Cl.
CPC ...... *H01L 27/11582* (2013.01); *H01L 23/481* (2013.01); *H01L 23/528* (2013.01); *H01L 23/5226* (2013.01); *H01L 27/11568* (2013.01); *H01L 27/11573* (2013.01); *H01L 29/1037* (2013.01)

(58) Field of Classification Search
CPC ......... H01L 27/11582; H01L 27/11573; H01L 23/481; H01L 27/11568; H01L 23/528; H01L 23/5226; H01L 29/1037; H01L 27/1157
See application file for complete search history.

(56) References Cited

U.S. PATENT DOCUMENTS

| | | | |
|---|---|---|---|
| 7,679,133 B2 | 3/2010 | Son et al. | |
| 7,800,163 B2 | 9/2010 | Izumi et al. | |
| 7,910,432 B2 | 3/2011 | Tanaka et al. | |
| 8,541,831 B2 | 9/2013 | Chae et al. | |

(Continued)

FOREIGN PATENT DOCUMENTS

KR    10-2011-0015337 A    2/2011

*Primary Examiner* — Michael Jung
(74) *Attorney, Agent, or Firm* — Muir Patent Law, PLLC

(57) ABSTRACT

Disclosed is a semiconductor memory device comprising a peripheral circuit structure on a first substrate, a second substrate on the peripheral circuit structure, a stack structure on the second substrate and comprising a plurality of gate electrodes, a through dielectric pattern penetrating the stack structure and the second substrate, and a vertical supporter on a top surface of the second substrate and vertically extending from the top surface of the second substrate and penetrating the stack structure and the through dielectric pattern.

20 Claims, 24 Drawing Sheets

(56) References Cited

U.S. PATENT DOCUMENTS

| | | | |
|---|---|---|---|
| 8,956,968 B2 | 2/2015 | Higashitani et al. | |
| 9,412,749 B1 | 8/2016 | Shimabukuro et al. | |
| 9,653,562 B2 | 5/2017 | Kim et al. | |
| 9,679,907 B1 * | 6/2017 | Kaneko | H01L 27/1157 |
| 9,691,782 B1 | 6/2017 | Hwang et al. | |
| 9,780,112 B2 | 10/2017 | Liu et al. | |
| 9,799,672 B2 | 10/2017 | Son et al. | |
| 9,831,266 B2 | 11/2017 | Kai et al. | |
| 2011/0169071 A1 * | 7/2011 | Uenaka | H01L 27/105 |
| | | | 257/326 |
| 2013/0052780 A1 * | 2/2013 | Kim | H01L 21/76897 |
| | | | 438/270 |
| 2015/0348987 A1 * | 12/2015 | Lee | H01L 27/11573 |
| | | | 257/326 |
| 2016/0155751 A1 * | 6/2016 | Shin | H01L 27/11578 |
| | | | 257/326 |
| 2016/0336340 A1 * | 11/2016 | Song | H01L 27/11582 |
| 2017/0053923 A1 | 2/2017 | Hwang et al. | |
| 2017/0179027 A1 * | 6/2017 | Kim | H01L 25/072 |
| 2017/0323900 A1 * | 11/2017 | Kanamori | H01L 27/11582 |

\* cited by examiner

SEMICONDUCTOR MEMORY DEVICE HAVING VERTICAL SUPPORTER PENETRATING THE GATE STACK STRUCTURE AND THROUGH DIELECTRIC PATTERN

CROSS-REFERENCE TO RELATED APPLICATION

This U.S. nonprovisional application claims priority under 35 U. S. C § 119 to Korean Patent Application No. 10-2018-0040088 filed on Apr. 6, 2018 in the Korean Intellectual Property Office, the entire contents of which are hereby incorporated by reference.

BACKGROUND

Example embodiments of inventive concepts relate to a semiconductor memory device, and more particularly, to a three-dimensional semiconductor memory device with enhanced reliability.

Semiconductor devices have been highly integrated for satisfying high performance and low manufacture costs which are desired by customers. Since integration of the semiconductor devices is an important factor in determining product price, high integration is increasingly requested in particular. Integration of typical two-dimensional or planar semiconductor memory devices is primarily determined by the area occupied by a unit memory cell, such that it is greatly influenced by the level of technology for forming fine patterns. However, comparatively expensive processing equipment needed to increase pattern fineness may set a practical limitation on increasing the integration of the two-dimensional or planar semiconductor memory devices. Therefore, there have been proposed three-dimensional semiconductor memory devices having three-dimensionally arranged memory cells.

SUMMARY

Some embodiments of inventive concepts provide a semiconductor memory device with enhanced reliability.

An object of inventive concepts is not limited to the mentioned above, and other objects which have not been mentioned above will be clearly understood to those skilled in the art from the following description.

According to some embodiments of inventive concepts, a semiconductor memory device may comprise: a peripheral circuit structure on a first substrate; a second substrate on the peripheral circuit structure; a stack structure on the second substrate and comprising a plurality of gate electrodes; a through dielectric pattern penetrating the stack structure and the second substrate; and a vertical supporter on a top surface of the second substrate and vertically extending from the top surface of the second substrate and penetrating the stack structure and the through dielectric pattern.

According to some embodiments of inventive concepts, a semiconductor memory device may comprise: a peripheral circuit structure on a first substrate; a second substrate on the peripheral circuit structure and having a recess part exposing the peripheral circuit structure; a stack structure on the second substrate and comprising a plurality of gate electrodes; a through dielectric pattern on the recess part and penetrating the stack structure, the through dielectric pattern comprising: a first segment vertically overlapping the recess part; and a second segment surrounding the first segment and is disposed on a sidewall of the stack structure; and a vertical supporter in the second segment of the through dielectric pattern.

According to some embodiments of inventive concepts, a semiconductor memory device may comprise: a peripheral circuit structure on a first substrate; a second substrate on the peripheral circuit structure and having a recess part exposing the peripheral circuit structure; a stack structure on a top surface of the second substrate and comprising a plurality of gate electrodes; a through dielectric pattern on the recess part and covering a sidewall of the stack structure; and a vertical supporter on a top surface of the second substrate and vertically extending from the top surface of the second substrate and penetrating the through dielectric pattern and the stack structure. The vertical supporter may comprise a semiconductor material.

DETAILED DESCRIPTION OF EMBODIMENTS

Figure 1:
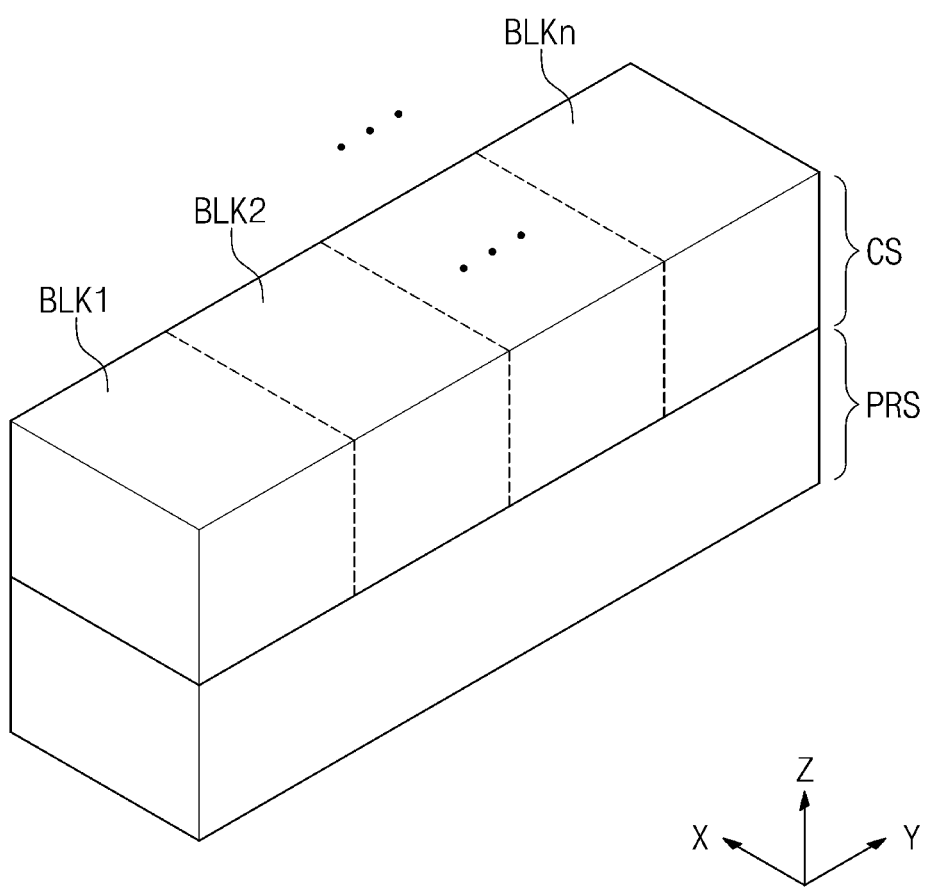
FIG. 1 illustrates a simplified perspective view showing a semiconductor memory device according to exemplary embodiments of inventive concepts.

FIG. 1 illustrates a simplified perspective view showing a semiconductor memory device according to exemplary embodiments of inventive concepts.

Referring to FIG. 1, a semiconductor memory device according to some embodiments may include a peripheral circuit structure PRS and a cell array structure CS stacked on the peripheral circuit structure PRS. For example, when viewed in plan, the peripheral circuit structure PRS and the cell array structure CS may overlap each other.

In an exemplary embodiment, the peripheral circuit structure PRS may include a page buffer, control circuits, and row and column decoders that control the cell array structure CS of the semiconductor memory device.

The cell array structure CS may include a plurality of memory blocks BLK1 to BLKn each of which is a data erasure unit. For example, each of the memory blocks BLK1 to BLKn may be configured to clear or overwrite data stored therein as part of a single erase operation. A memory block, such as one of BLK1 to BLKn may be the minimum unit of erasure for the semiconductor memory device. According to exemplary embodiments, each of the memory blocks BLK1 to BLKn may include a memory cell array having a three-dimensional or vertical structure. The memory cell array may include three-dimensionally arranged memory cells and a plurality of word lines and bit lines electrically connected to the memory cells. In an exemplary embodiment, the plurality of memory blocks BLK1 to BLKn may correspond to stack structures DST and CST which will be discussed below. The memory cell array having the three-dimensional structure will be discussed below in detail with reference to the accompanying drawings.

Figure 2:
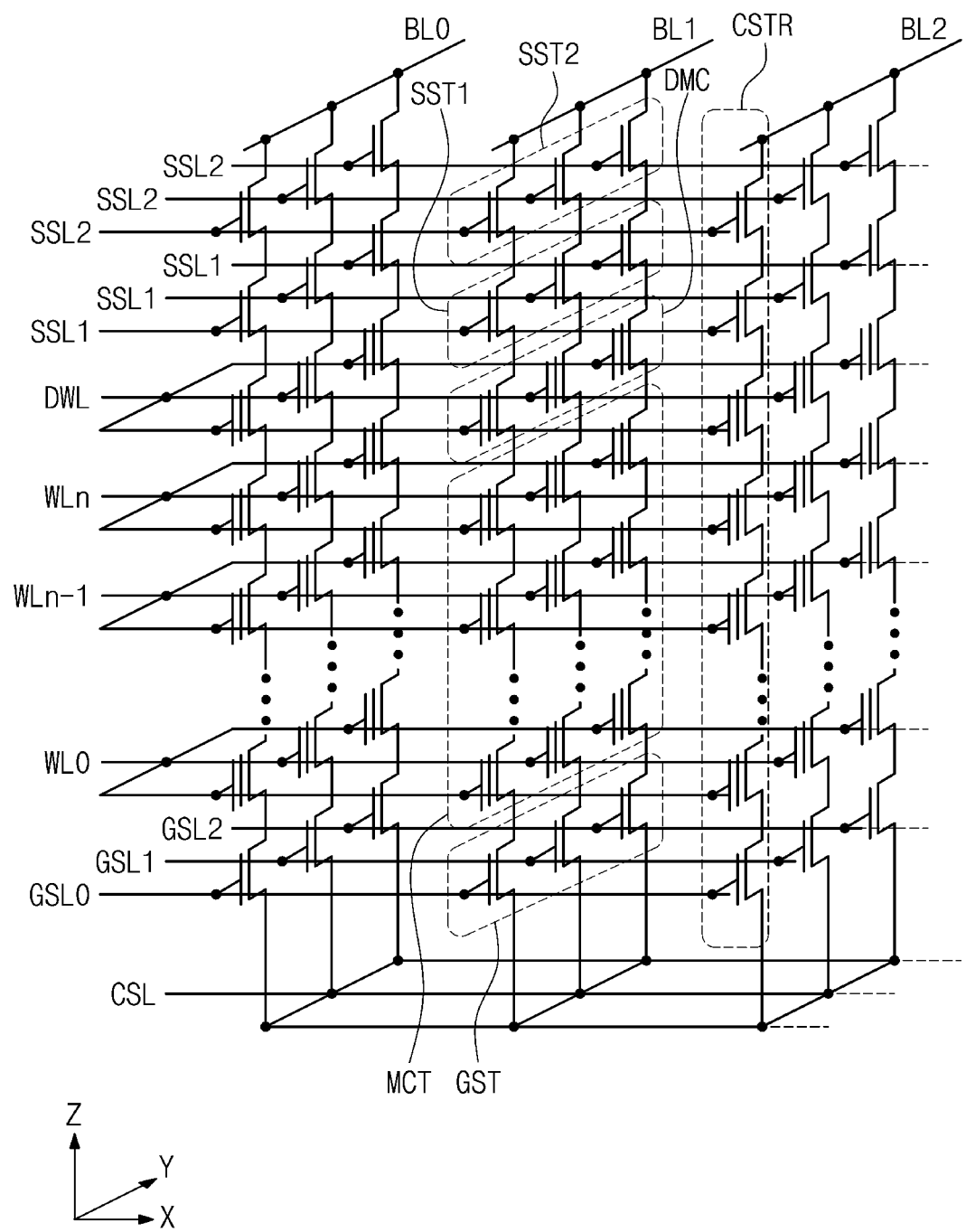
FIG. 2 illustrates a simplified circuit diagram showing a cell array of a semiconductor memory device according to exemplary embodiments of inventive concepts.

FIG. 2 illustrates a simplified circuit diagram showing a cell array of a semiconductor memory device according to exemplary embodiments of inventive concepts.

Referring to FIG. 2, a cell array of a three-dimensional semiconductor memory device according to some embodiments of inventive concepts may include a common source line CSL, a plurality of bit lines BL0 to BL2, and a plurality of cell strings CSTR connected between the common source line CSL and the bit lines BL0 to BL2. Each of the cell strings CSTR may be formed as a NAND cell string comprising a plurality of memory cells MCT (e.g., memory cell transistors) connected in series.

The cell strings CSTR may extend along a third direction Z extending from a plane that is parallel first and second directions X and Y. Each of the X, Y and Z directions may be perpendicular to each other. The bit lines BL0 to BL2 may be spaced apart from each other in the first direction X and may extend in the second direction Y.

A plurality of cell strings CSTR may be connected in parallel to each of the bit lines BL0 to BL2. The plurality of cell strings CSTR may be connected in common to the common source line CSL. For example, the plurality of cell strings CSTR may be disposed between a corresponding one of the plurality of bit lines BL0 to BL2 and the same common source line CSL. In some examples, the common source line CSL may be provided in plural, and the plurality of common source lines CSL may be two-dimensionally arranged. Each of the plurality of common source lines CSL may be supplied with the same voltage or electrically controlled independently of each other.

In an exemplary embodiment, each of the cell strings CSTR may include string select transistors SST1 and SST2 connected in series, memory cells MCT connected in series, and a ground select transistor GST. Each of the memory cells MCT may be a memory cell transistor and include a data storage element.

For example, each of the cell strings CSTR may include first and second string select transistors SST1 and SST2 connected in series. The second string select transistor SST2 may be coupled to one of the bit lines BL0 to BL2, and the ground select transistor GST may be coupled to the common source line CSL. The memory cells MCT may be connected in series between the first string select transistor SST1 and the ground select transistor GST.

Each of the cell strings CSTR may further include a dummy cell DMC connected between the first string select transistor SST1 and the memory cell MCT. Although not shown in figures, the dummy cell DMC may also be connected between the ground select transistor GST and the memory cell MCT. In an exemplary embodiment, the first string select transistor SST1 may be controlled by a first string select line SSL1, and the second string select transistor SST2 may be controlled by a second string select line SSL2. The memory cells MCT may be controlled by a plurality of word lines WL0 to WLn, and the dummy cell DMC may be controlled by a dummy word line DWL. The ground select transistor GST may be controlled by one of ground select lines GSL0 to GLS2. The common source line CSL may be connected in common to sources of the ground select transistors GST. For example, activation of one of word lines WL0 to WLn by providing a driving voltage of a certain level may turn on memory cells MCT connected to such a word line or may turn on memory cells MCT connected to such a word line in dependence on a charge stored in the memory cell MCT.

One cell string CSTR may include a plurality of memory cells MCT at different distances from the common source line CSL. A plurality of word lines WL0 to WLn and DWL may be disposed between the common source lines CSL and the bit lines BL0 to BL2.

The memory cells MCT may include gate electrodes, which are at substantially the same distance from the common source lines CSL, connected in common to one of the word lines WL0 to WLn and DWL to have an equipotential state. In contrast, although the gate electrodes of the memory cells MCT are at substantially the same distance from the common source lines CSL, the gate electrodes disposed at different rows or columns may be independently controlled.

The ground select lines GSL0 to GSL2 and the string select lines SSL1 and SSL2 may extend along the first direction X and may be spaced apart from each other in the second direction Y. The ground select lines GSL0 to GSL2 may be located at the same level as each other, the string select lines SSL1 may be located at the same level as each other and the string select lines SSL2 may be located at the same level as each other, and each of these lines may be electrically insulated from each other and constitute a separate electrical node.

Figure 3:
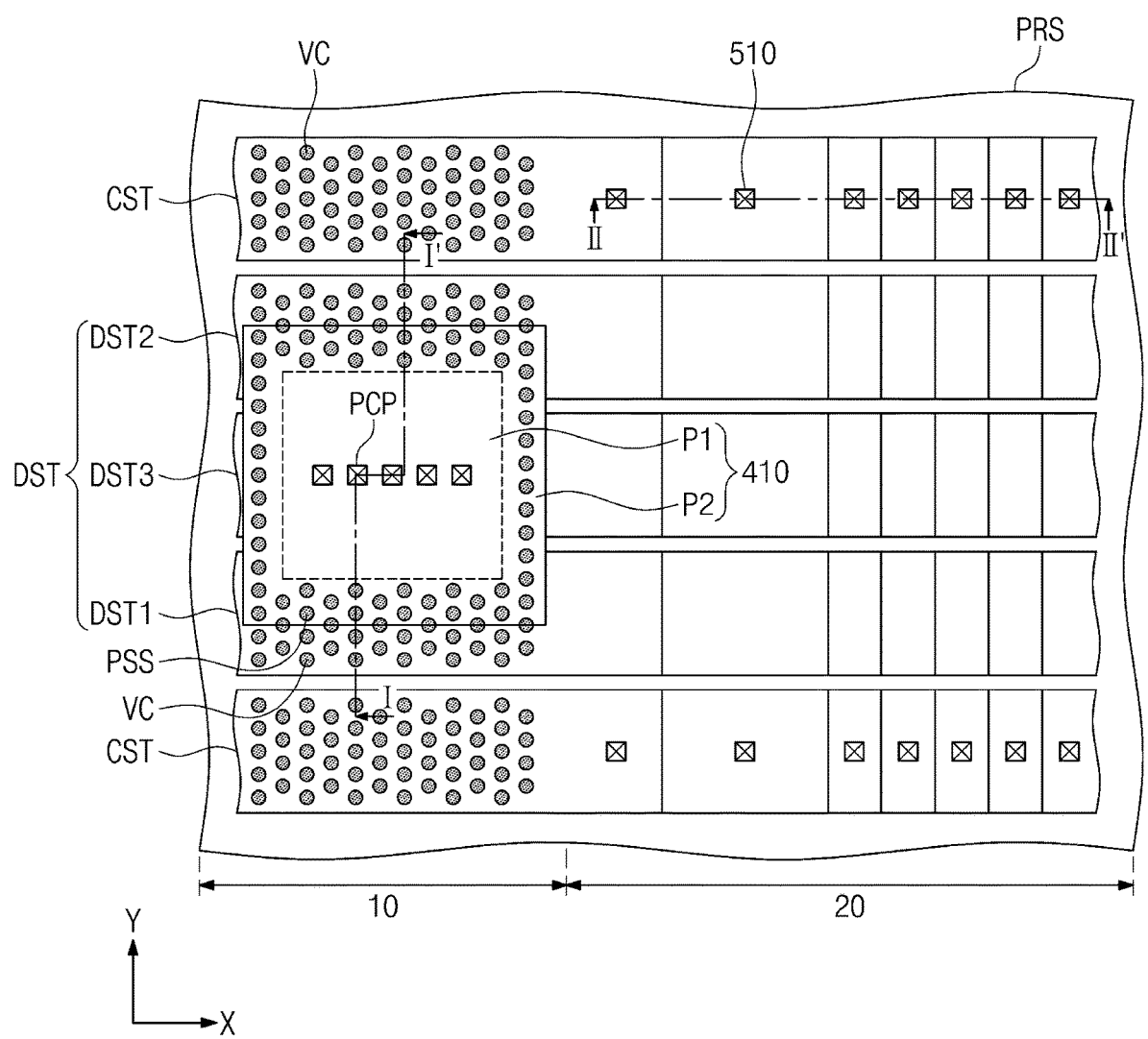
FIG. 3 illustrates a plan view showing a semiconductor memory device according to exemplary embodiments of inventive concepts.
Figure 4:
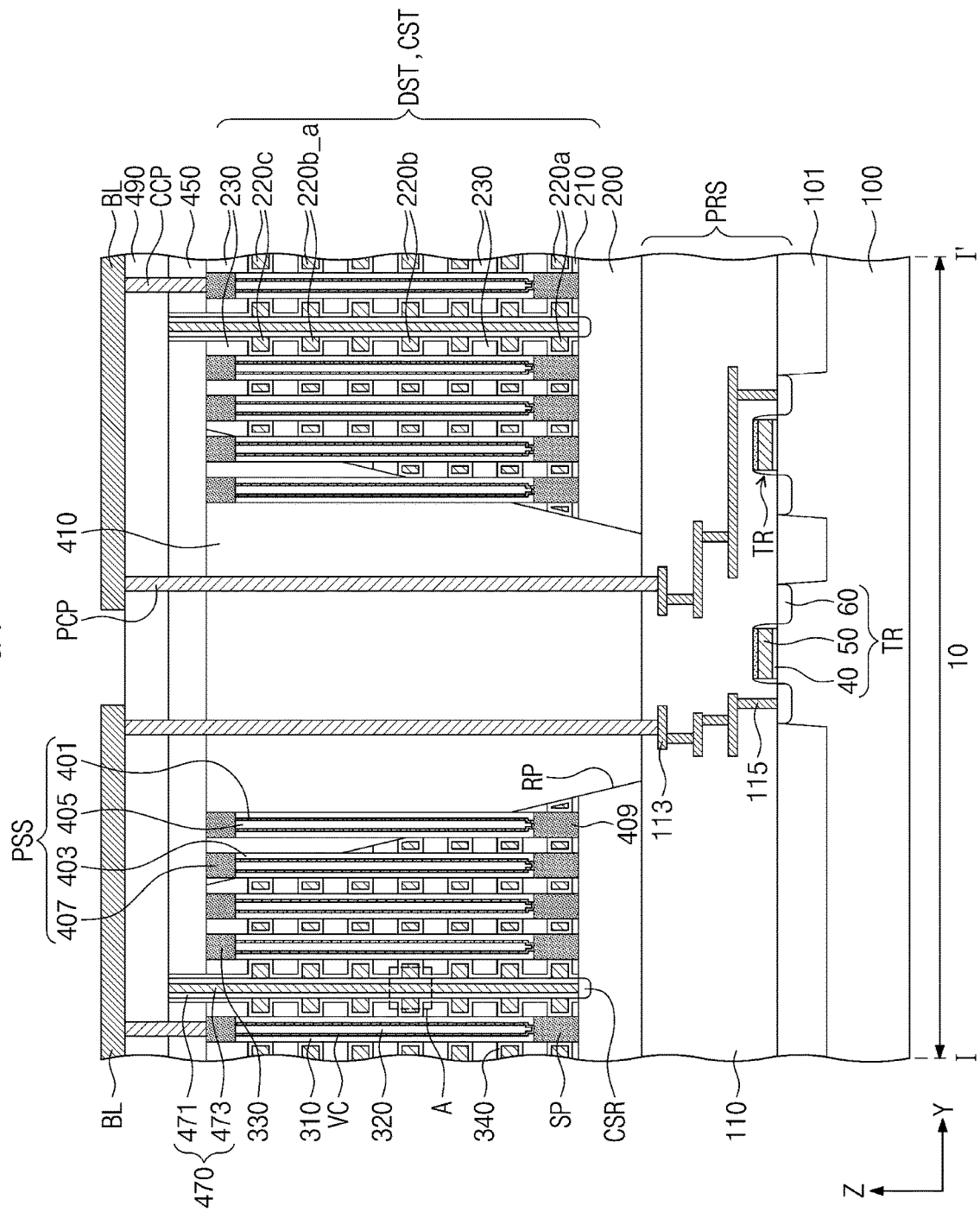
FIG. 4 illustrates a cross-sectional view taken along line I-I' of FIG. 3, showing a semiconductor memory device according to exemplary embodiments of inventive concepts.
Figure 5:
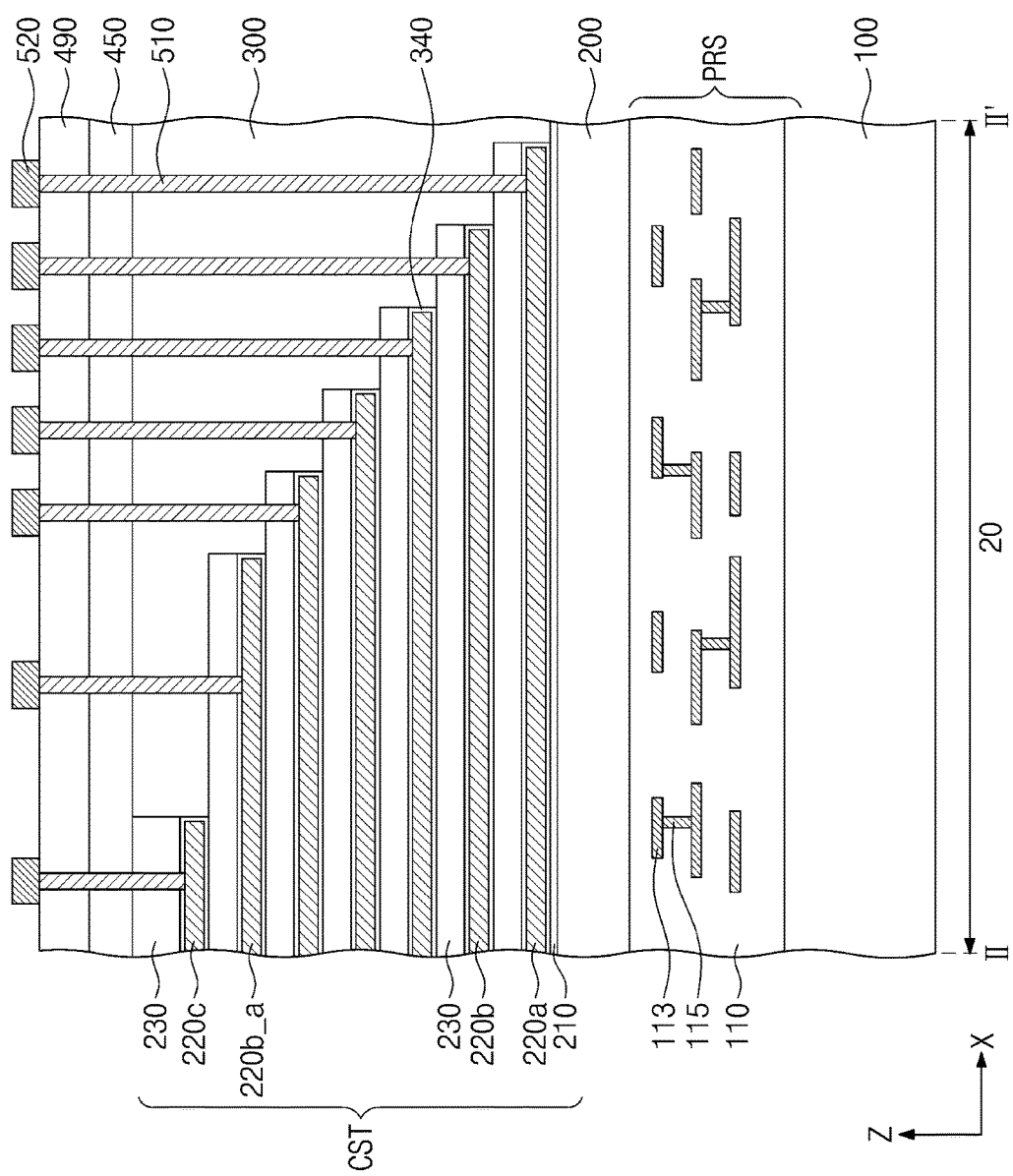
FIG. 5 illustrates a cross-sectional view taken along line II-IF of FIG. 3, showing a semiconductor memory device according to exemplary embodiments of inventive concepts.
Figure 6:
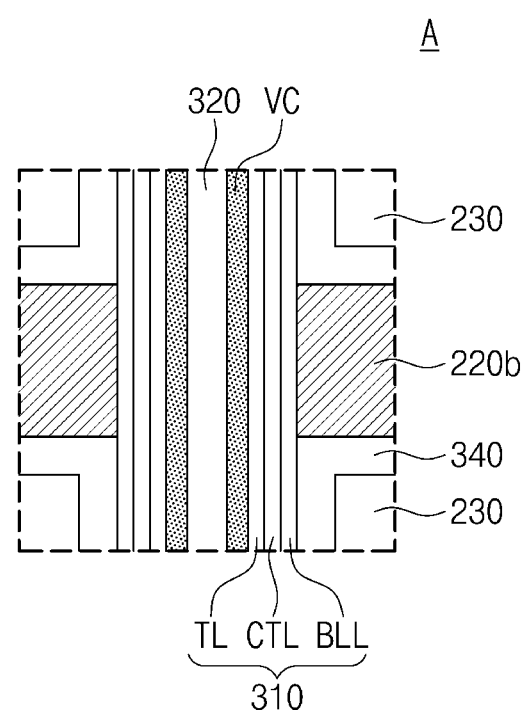
FIG. 6 illustrates an enlarged view showing section A of FIG. 3.

According to exemplary embodiments, a dummy cell DMC may be a memory cell connected to a word line that is not electrically activated to receive read and/or write voltages, and/or may be a memory cell whose data is ignored by a memory controller (e.g., not read out of the memory cell into a page buffer, in contrast to memory cells MCT that are not dummy memory cells). As such, whether or not data is stored in a dummy cell DMC, the dummy cell DMC may not function to result in communication of any data in such dummy cells DMCs to a source external to the semiconductor memory device. FIG. 3 illustrates a plan view showing a semiconductor memory device according to exemplary embodiments of inventive concepts. FIG. 4 illustrates a cross-sectional view taken along line I-I' of FIG. 3, showing a semiconductor memory device according to exemplary embodiments of inventive concepts. FIG. 5 illustrates a cross-sectional view taken along line II-IF of FIG. 3, showing a semiconductor memory device according to exemplary embodiments of inventive concepts. FIG. 6 illustrates an enlarged view showing section A of FIG. 3.

Referring to FIGS. 3, 4, 5, and 6, a semiconductor memory device may include a peripheral circuit structure PRS on a first substrate 100, stack structures DST and CST on the peripheral circuit structure PRS, and a through dielectric pattern 410 penetrating the stack structures DST and CST.

The first substrate 100 may be formed of a crystalline semiconductor material, and may be or include a silicon substrate, a silicon-germanium substrate, a germanium substrate, and/or a single crystalline epitaxial layer grown on a single crystalline silicon substrate. A device isolation layer 101 may be disposed trenches formed in the first substrate 100. The device isolation layer 101 may define separate active regions formed within the first substrate 100. Each of the active regions may be formed by doping charge carrier impurities into the first substrate 100. The device isolation layer 101 may include an insulating material, such as a silicon oxide layer.

The peripheral circuit structure PRS may be disposed in and on the first substrate 100. The peripheral circuit structure PRS may include transistors TR, a first interlayer dielectric layer 110, wiring lines 113, and vias 115. The transistors TR may be disposed on the active regions of the first substrate 100. The transistors TR may include a peripheral gate dielectric layer 40, a peripheral gate electrode 50, and source/drain regions 60. The peripheral gate dielectric layer 40 may be disposed on the active regions of the first substrate 100. The peripheral gate dielectric layer 40 may include, for example, a silicon oxide layer or a thermal oxide layer. The peripheral gate electrode 50 may be disposed on the peripheral gate dielectric layer 40. The peripheral gate electrode 50 may include, for example, metal or impurity-doped polysilicon. The source/drain regions 60 may be disposed in the active regions of the first substrate 100 on opposite sides of the peripheral gate electrode 50. The source/drain regions 60 may have a different conductivity from that of the first substrate 100.

The first interlayer dielectric layer 110 may be disposed on the first substrate 100. The first interlayer dielectric layer 110 may cover the transistors TR. The first interlayer dielectric layer 110 may include a plurality of layers. The first interlayer dielectric layer 110 may include, for example, a silicon oxide layer. The wiring lines 113 and the vias 115 may be disposed in the first interlayer dielectric layer 110. The wiring lines 113 at different levels may be connected to each other through the vias 115 interposed therebetween. The transistors TR may be connected through the vias 115 to the wiring lines 113. The wiring lines 113 and the vias 115 may include metal, such as copper.

A second substrate 200 may be disposed on the peripheral circuit structure PRS. The second substrate 200 may include a cell array region 10 and a pad region 20. The pad region 20 may include various pads of a device which may be conductive terminals connected to internal wiring and/or logic circuits of the device, and may transmit signals and/or supply voltages between an internal wiring and/or internal circuit of the device and an external source. The second substrate 200 may be formed of or include a crystalline semiconductor material, such as silicon (Si), germanium (Ge), silicon germanium (SiGe), gallium arsenic (GaAs), indium gallium arsenic (InGaAs), aluminum gallium arsenic (AlGaAs), or a combination thereof. The second substrate 200 may include a semiconductor doped with charge carrier impurities or an intrinsic semiconductor with no doped charge carrier impurities. The second substrate 200 may have a single crystalline structure, an amorphous structure, and/or a polycrystalline structure.

According to exemplary embodiments, each of the first substrate 100 and the second substrate 200 and the elements formed thereon may be a semiconductor chip and may be formed and cut from a wafer. In addition, according to exemplary embodiments, the bonding of these substrates/chips can be done at the wafer level (e.g., bonding wafer A with substrate 100 to wafer B with substrate 200) and then cutting the bonded wafers.

The stack structures DST and CST may be disposed on the cell array region 10 and the pad region 20 of the second substrate 200. The stack structures DST and CST may extend in a first direction X on the second substrate 200 and may be spaced apart in a second direction Y intersecting the first direction X. The stack structures DST and CST may overlap the peripheral circuit structure PRS. A common source region CSR may be disposed in the second substrate 200 between the stack structures DST and CST. The common source region CSR may extend in the first direction X. The common source region CSR may be conductive and formed by doping a portion of the second substrate with charge carrier impurities, (e.g., with impurities having a different conductivity type from that of the second substrate 200).

The stack structures DST and CST may include dummy stack structures DST and cell stack structures CST. In an exemplary embodiment, the dummy stack structures DST may be disposed between the cell stack structures CST adjacent to each other in the second direction Y. Each of the stack structures DST and CST may include a buffer oxide layer 210, gate electrodes 220a, 220b, 200b_a, and 220c, and insulating patterns 230, which gate electrodes and insulating patterns are alternately and repeatedly stacked on the buffer oxide layer 210. The buffer oxide layer 210 may include, for example, a thermal oxide layer or a silicon oxide layer. The gate electrodes 220a, 220b, 220b_a, and 220c may include a ground select gate electrode 220a, cell gate electrodes 220b and 220b_a, and a string select gate electrode 220c. The ground select gate electrode 220a and the string select gate electrode 220c may correspond respectively to a lowermost one (e.g., adjacent to a top surface of the second substrate 200) and an uppermost one (e.g., further away from the top surface of the second substrate 200 in a vertical direction (Z direction)) of the gate electrodes 220a, 220b, 220b_a, and 220c. The cell gate electrodes 220b and 220b_a may be disposed between the ground select gate electrode 220a and the string select gate electrode 220c. In an exemplary embodiment, an uppermost one 220b_a of the cell gate electrodes 220b and 220b_a may be a dummy cell gate electrode.

Figure 12:
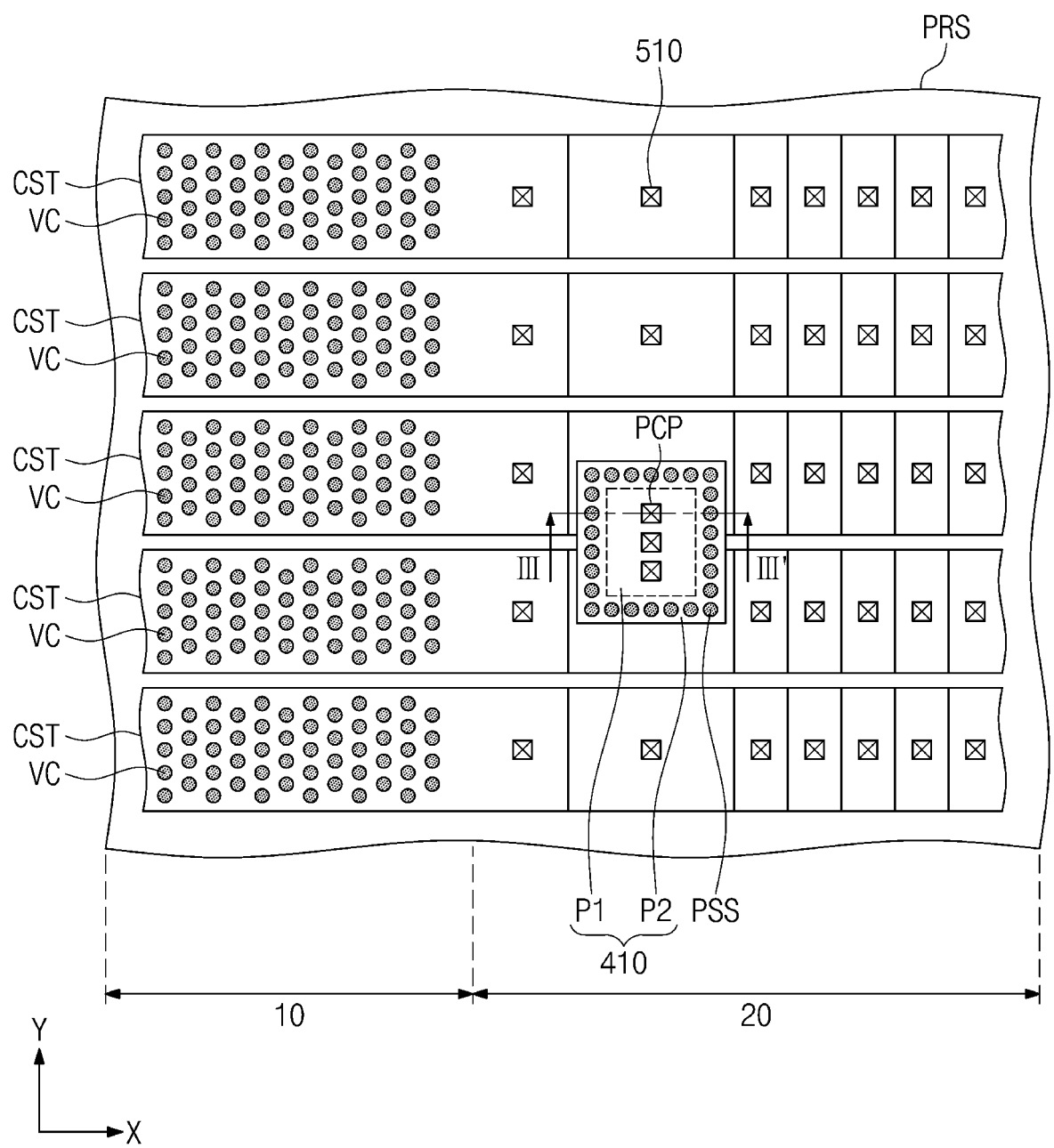
FIG. 12 illustrates a plan view showing a semiconductor memory device according to exemplary embodiments of inventive concepts.
Figure 14:
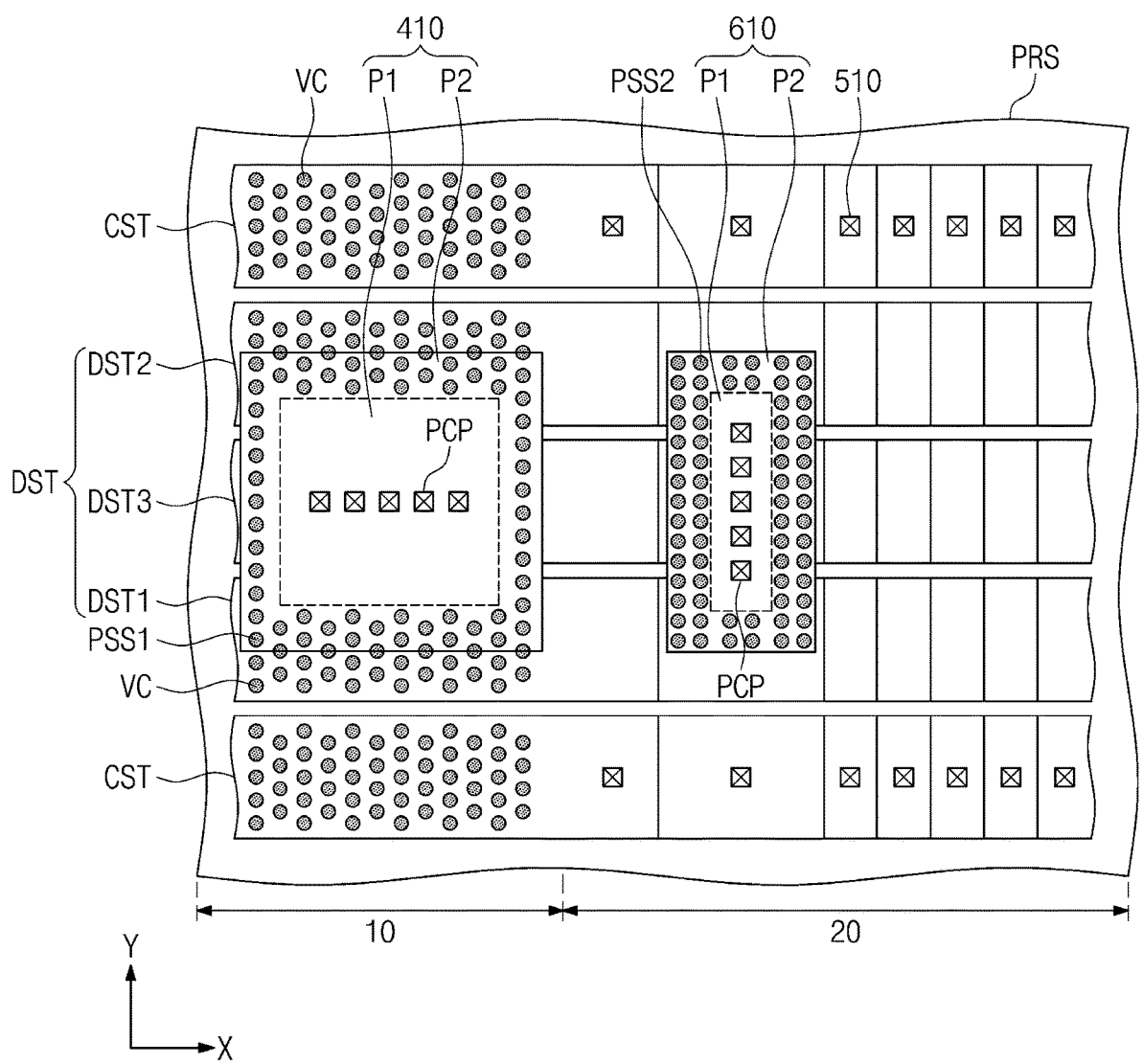
FIG. 14 illustrates a plan view showing a semiconductor memory device according to exemplary embodiments of inventive concepts.

The stack structures DST and CST may have stepwise structures on the pad region 20 of the second substrate 200. Each of the stack structures DST and CST may have a height in the Z direction that decreases with increasing distance from the cell array region 10. For example, a length in the second direction Y of each of the gate electrodes 220a, 220b, 220b_a, and 220c may decrease with increasing distance from the second substrate 200. In an exemplary embodiment, each of the gate electrodes 220a, 220b, 220b_a, and 220c may have an end on the pad region 20 of the second substrate 200. The end of each of the ground and cell gate electrodes 220a, 220b, and 220b_a may correspond to an exposed portion that is not covered with a next overlying gate electrode. The end of the string select gate electrode 220c may be a portion disposed on the pad region 20. In an exemplary embodiment, as shown in FIGS. 12 and 14, in consideration of a through dielectric pattern 410 or 610 disposed on the pad region 20 of the second substrate 200, the end of the uppermost cell gate electrode 220b_a of the cell gate electrodes 220b and 220b_a may have a planar area greater than that of the end of the ground select gate electrode 220a and those of the ends of other cell gate electrodes 220b.

The insulating patterns 230 may be disposed between the gate electrodes 220a, 220b, 220b_a, and 220c adjacent to each other in a third direction Z perpendicular to a top surface of the second substrate 200, and also disposed on the string select gate electrode 220c. The insulating patterns 230 may include, for example, a silicon oxide layer. A length in the second direction Y of each of the insulating patterns 230 may decrease with increasing distance from the second substrate 200. The length in the second direction Y of each of the insulating patterns 230 may be substantially the same as the length in the second direction Y of a next underlying gate electrode. For example, a sidewall of each insulating patterns 230 in the Z direction may be substantially coplanar with a sidewall of a next underlying gate electrode in the Z direction. The insulating patterns 230 may cover the ends of the gate electrodes 220a, 220b, 220b_a, and 220c.

An interlayer dielectric pattern 300 may cover the stepwise structures of the stack structures DST and CST, which stepwise structures are disposed on the pad region 20 of the second substrate 200. The interlayer dielectric pattern 300 may have a top surface at the same level as that of a top surface of an uppermost insulating pattern 230 that covers the end of the string select gate electrode 200c.

Vertical channels VC may be provided in the stack structures DST and CST disposed on the cell array region 10 of the second substrate 200. The vertical channels VC may be disposed on the top surface of the second substrate 200 and may penetrate the stack structures DST and CST. The vertical channels VC may be arranged in a zigzag fashion or in a straight line along the second direction Y. The vertical channels VC may have a hollow pipe shape, a cylindrical shape, or a cup shape, but the disclosure is not limited thereto. Each of the vertical channels VC may include a single layer or a plurality of layers. The vertical channels VC may include, for example, one or more of a single crystalline silicon layer, an organic semiconductor layer, and carbon nano-structures.

In an exemplary embodiment, dummy vertical channels may be defined to refer to the vertical channels VC disposed in the dummy stack structures DST. For example, the dummy vertical channels may not be electrically connected to the second substrate 200. The vertical channels VC disposed in the cell stack structures CST may be electrically connected to the second substrate 200. The vertical channels VS disposed in the cell stack structures CST may serve as channels of the select transistors SST and GST, of the memory cells MCT, and of the dummy cell DMC discussed above with reference to FIG. 2.

Semiconductor pillars SP may be disposed between the vertical channels VC and the second substrate 200. The semiconductor pillars SP may be disposed on the top surface of the second substrate 200 and may penetrate the ground select gate electrode 220a. The semiconductor pillars SP and the vertical channels VC may contact each other. In an exemplary embodiment, the semiconductor pillars SP may not be electrically connected to the vertical channels VC disposed in the dummy stack structures DST. In contrast, the semiconductor pillars SP may be electrically connected to the vertical channels VC disposed in the cell stack structures CST. The semiconductor pillars SP may be or include an intrinsic semiconductor or a semiconductor whose conductivity is the same as that of the second substrate 200.

Charge storage structures 310 may be disposed between the vertical channels VC and the gate electrodes 220a, 220b, 220b_a, and 220c. The charge storage structures 310 may extend in the third direction Z along outer walls of the vertical channels VC. For example, the charge storage structures 310 may have shapes surrounding the outer walls of the vertical channels VC. The charge storage structures 310 may include a single layer or a plurality of layers consisting of, for example, one or more of a silicon oxide layer, a silicon nitride layer, a silicon oxynitride layer, and a high-k dielectric layer.

For example, as shown in FIG. 6, each of the charge storage structures 310 may include a tunnel insulating layer TL, a blocking insulating layer BLL, and a charge storage layer CTL. The tunnel insulating layer TL may be adjacent to the vertical channel VC and may surround the outer wall of the vertical channel VC. The blocking insulating layer BLL may be adjacent to the gate electrodes 220a, 220b, 220b_a, and 220c. The charge storage layer CTL may be disposed between the tunnel insulating layer TL and the blocking insulating layer BLL. The tunnel insulating layer TL may include, for example, a silicon oxide layer or a high-k dielectric layer (e.g., aluminum oxide ($Al_2O_3$) or hafnium oxide ($HfO_2$)). The blocking insulating layer BLL may include, for example, a silicon oxide layer or a high-k dielectric layer (e.g., aluminum oxide ($Al_2O_3$) or hafnium oxide ($HfO_2$)). The charge storage layer CTL may include, for example, a silicon nitride layer.

Gap-fill layers 320 may be disposed in inner spaces surrounded by the vertical channels VC. The gap-fill layers 320 may include, for example, a silicon oxide layer, a silicon nitride layer, or a silicon oxynitride layer. Pads 330 may be disposed on upper portions of the vertical channels VC, of the charge storage structures 310, and of the gap-fill layers 320. The pads 330 may include a conductive material or a semiconductor material doped with impurities whose conductivity is different from that of the vertical channels VC. In an exemplary embodiment, the vertical channels VC disposed in the dummy stack structures DST may not be electrically connected to the pads 330 disposed on the upper portions of the vertical channels VC. In an exemplary embodiment, the vertical channels VC disposed in the cell stack structures CST may be electrically connected to the pads 330 disposed on the upper portions of the vertical channels VC.

Horizontal insulating layers 340 may be disposed between the charge storage structures 310 and the gate electrodes 220a, 220b, 220b_a, and 220c, and may extend onto top and bottom surfaces of the gate electrodes 220a, 220b, 220ba, and 220c. The horizontal insulating layer 340 may include, for example, a silicon oxide layer (e.g., $SiO_2$) or a high-k dielectric layer (e.g., aluminum oxide ($Al_2O_3$) or hafnium oxide ($HfO_2$)).

On the cell array region 10 of the second substrate 200, the through dielectric pattern 410 may penetrate the dummy stack structures DST and the second substrate 200. For example, on the cell array region 10 of the second substrate 200, one through dielectric pattern 410 may penetrate a plurality of dummy stack structures DST and the second substrate 200. The through dielectric pattern 410 may be spaced apart from the vertical channels VC disposed in the dummy stack structures DST. The dummy stack structures DST may include a first dummy stack structure DST1, a second dummy stack structure DST2, and a third dummy stack structure DST3 between the first and second dummy stack structures DST1 and DST2. For example, the through dielectric pattern 410 may penetrate the third dummy stack structure DST3, while running in the second direction Y across the third dummy stack structure DST3. The through dielectric pattern 410 may penetrate the first and second dummy stack structures DST1 and DST2, while partially running across the first and second dummy stack structures DST1 and DST2. The through dielectric pattern 410 may divide the third dummy stack structure DST3 into a plurality of pieces in the first direction X.

The through dielectric pattern 410 may contact the peripheral circuit structure PRS. For example, the through dielectric pattern 410 may contact the first interlayer dielectric layer 110. The dummy stack structures DST may have sidewalls that contact the through dielectric pattern 410 and are sloped relative to a top surface of the first substrate 100. The second substrate 200 may have side surfaces that contact the through dielectric pattern 410 and are sloped relative to the top surface of the first substrate 100. The sidewalls of the dummy stack structures DST may align with the side surfaces, which contact the through dielectric pattern 410, of the second substrate 200. The through dielectric pattern 410 may have a top surface at the same level as that of top surfaces of the pads 330. The through dielectric pattern 410 may include, for example, high density plasma (HDP) oxide, tetraethylorthosilicate (TEOS), plasma enhanced tetraethylorthosilicate (PE-TEOS), $O_3$-tetratthylorthosilicate ($O_3$-TEOS), undoped silicate glass (USG), phosphosilicate glass (PSG), borosilicate glass (BSG), borophosphosilicate glass (BPSG), fluorosilicate glass (FSG), spin on glass (SOG), tonen silazene (TOSZ), or a combination thereof.

In an exemplary embodiment, the second substrate 200 may have a recess part RP. The recess part RP may be disposed in the cell array region 10 of the second substrate 200. The recess part RP may be a section where the through dielectric pattern 410 penetrates the second substrate 200. The recess part RP may be formed as a hollow space (e.g., cavity) within the second substrate 200 partially exposing middle area of the first interlayer dielectric layer 110.

When viewed in plan, the through dielectric pattern 410 may include a first segment P1 vertically overlapping the recess part RP of the second substrate 200 and a second segment P2 disposed on the sidewalls of the dummy stack structures DST. When viewed in plan, the second segment P2 may surround the first segment P1.

On the top surface of the second substrate 200, vertical supporters PSS may penetrate the through dielectric pattern 410 and the dummy stack structures DST. For example, the vertical supporters PSS may penetrate the second segment P2 of the through dielectric pattern 410, and also penetrate the dummy stack structures DST vertically overlapping the second segment P2 of the through dielectric pattern 410. The vertical supporters PSS may contact the top surface of the second substrate 200. The vertical supporters PSS may be arranged along the second segment P2 of the through dielectric pattern 410. When viewed in plan, the first segment P1 of the through dielectric pattern 410 may be surrounded by the vertical supporters PSS. According to some exemplary embodiments of inventive concepts, the vertical supporters PSS may support portions of the dummy stack structures DST, which portions vertically overlap the second segment P2 of the through dielectric pattern 410.

Each of the vertical supporters PSS may include a first vertical layer 401, a second vertical layer 403, a third vertical layer 405, and a capping pattern 407. The first vertical layer 401 may be disposed on the top surface of the second substrate 200 and may penetrate the dummy stack structures DST. The first vertical layer 401 may have a hollow pipe shape, a cylindrical shape, or a cup shape, but the disclosure is not limited thereto. The first vertical layer 401 may include a single layer or a plurality of layers. The first vertical layer 401 may include, for example, one or more of a single crystalline silicon layer, an organic semiconductor layer, and carbon nano-structures. In an exemplary embodiment, the first vertical layer 401 may have the same layer structure as that of the vertical channels VC and may include the same material composition as that of the vertical channels VC.

The second vertical layer 403 may be disposed on a sidewall of the first vertical layer 401. The second vertical layer 403 may extend in the third direction Z along an outer wall of the first vertical layer 401. The second vertical layer 403 may include a single layer or a plurality of layers consisting of, for example, one or more of a silicon oxide layer, a silicon nitride layer, a silicon oxynitride layer, and a high-k dielectric layer (e.g., aluminum oxide ($Al_2O_3$) or hafnium oxide ($HfO_2$)). In an exemplary embodiment, the second vertical layer 403 may have the same layer structure as that of the charge storage structures 310 and may include the same material composition as that of the charge storage structures 310.

The third vertical layer 405 may be disposed in an inner space surrounded by the first vertical layer 401. The third vertical layer 405 may include an insulating material, for example, a silicon oxide layer, a silicon nitride layer, or a silicon oxynitride layer. In an exemplary embodiment, the third vertical layer 405 may have the same layer structure as that of the gap-fill layer 320 and may include the same material composition as that of the vertical channels VC.

The capping pattern 407 may be disposed on upper portions of the first, second, and third vertical layers 401, 403, and 405. The capping pattern 407 may include a conductive material or a semiconductor material doped with impurities whose conductivity is different from that of the vertical channels VC. In an exemplary embodiment, the capping pattern 407 may have the same layer structure as that of the pads 330 and may include the same material composition as that of the pads 330.

Vertical pillars 409 may be disposed between the vertical supporters PSS and the second substrate 200. The vertical pillars 409 may contact the vertical supporters PSS and the second substrate 200. The vertical pillars 409 may be or include an intrinsic semiconductor or a semiconductor whose conductivity is the same as that of the second substrate 200. In an exemplary embodiment, the vertical pillars 409 may have the same layer structure as that of the semiconductor pillars SP and may include the same material composition as that of the semiconductor pillars SP.

A second interlayer dielectric layer 450 may be disposed on the stack structures DST and CST and the interlayer dielectric pattern 300. The second interlayer dielectric layer 450 may cover a top surface of the interlayer dielectric pattern 300 and top surfaces of the stack structures DST and CST. The second interlayer dielectric layer 450 may include, for example, a silicon oxide layer.

A contact structure 470 may be disposed between the stack structures DST and CST adjacent to each other in the second direction Y. The contact structure 470 may extend in the first direction X and may penetrate the second interlayer dielectric layer 450. When viewed in plan, the contact structure 470 may have a rectangular or linear shape extending in the first direction X. Alternatively, the contact structure 470 may be provided in plural, and the plurality of contact structures 470 may be arranged in the first direction X along the common source region CSR. In this exemplary embodiment, the plurality of contact structures 470 may have a pillar shape.

The contact structure 470 may include a spacer 471 and a common source contact 473. The common source contact 473 may be electrically connected to the common source region CSR. The common source contact 473 may include, for example, metal (e.g., tungsten, copper, or aluminum) or transition metal (e.g., titanium or tantalum). The spacer 471 may surround an outer wall of the common source contact 473. The spacer 471 may include, for example, an insulating material (e.g., a silicon oxide layer or a silicon nitride layer).

A third interlayer dielectric layer 490 may be disposed on the second interlayer dielectric layer 450. The third interlayer dielectric layer 490 may cover a top surface of the second interlayer dielectric layer 450 and a top surface of the contact structure 470. The third interlayer dielectric layer 490 may include, for example, a silicon oxide layer.

Cell contact plugs 510 may be disposed on the pad region 20 of the second substrate 200. The cell contact plugs 510 may be disposed on the ends of the gate electrodes 220a, 220b, 220b_a, and 220c of the cell stack structures CST. The cell contact plugs 510 may directly contact (i.e., no intervening elements present at the point of contact) top surfaces of the ends of the gate electrodes 220a, 220b, 220b_a, and 220c. In an exemplary embodiment, the cell contact plugs 510 may not be provided on the ends of the gate electrodes 220a, 220b, 220b_a, and 220c of the dummy stack structures DST. The cell contact plugs 510 may include one or more of metal (e.g., copper or tungsten) and metal nitride (e.g., TiN, TaN, or WN).

Channel contact plugs CCP may be provided on the pads 330 disposed in the cell stack structures CST. The channel contact plugs CCP may penetrate the third and second interlayer dielectric layers 490 and 450 and directly contact the pads 330 disposed in the cell stack structures CST. The channel contact plugs CCP may include, for example, one or more of metal (e.g., copper or tungsten) and metal nitride (e.g., TiN, TaN, or WN). In an exemplary embodiment, the channel contact plugs CCP may be provided neither on the pads 330 disposed in the dummy stack structures DST nor on the capping patterns 407 disposed in the dummy stack structures DST.

Peripheral contact plugs PCP may be disposed in the through dielectric pattern 410. The peripheral contact plugs PCP may penetrate the first segment P1 of the through dielectric pattern 410 and may be disposed in the first interlayer dielectric layer 110 exposed to the recess part RP of the second substrate 200. The peripheral contact plugs PCP may be spaced apart from the dummy stack structures DST. The peripheral contact plugs PCP may be electrically connected to the transistors TR. The peripheral contact plugs PCP may include, for example, one or more of metal (e.g., copper or tungsten) and metal nitride (e.g., TiN, TaN, or WN). The number of the peripheral contact plugs PCP may be different from that shown in figures, and an arrangement of the peripheral contact plugs PCP is not limited to that shown in figures.

Connection lines 520 may be disposed on the third interlayer dielectric layer 490. The connection lines 520 may be electrically connected to the cell contact plugs 510.

Bit lines BL may be disposed on the third interlayer dielectric layer 490. The bit lines BL may extend in the second direction Y and run across the stack structures DST and CST. The bit lines BL may be spaced apart from each other in the first direction X on the third interlayer dielectric layer 490. Each of the bit lines BL may be electrically connected to a corresponding one of the channel contact plugs CCP and a corresponding one of the peripheral contact plugs PCP. In an exemplary embodiment, the transistors TR may provide signals through the peripheral contact plugs PCP to the bit lines BL.

Figure 7:
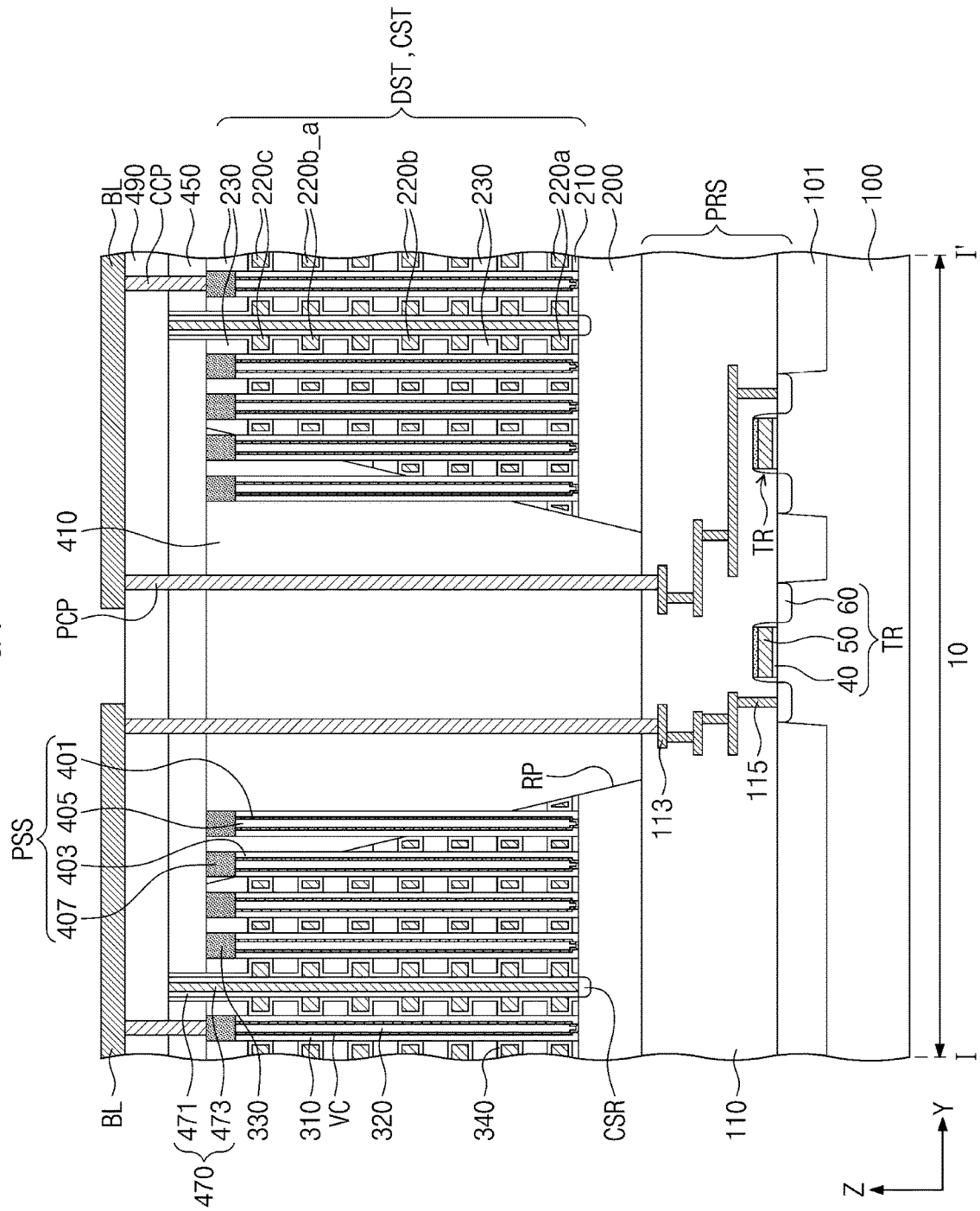
FIG. 7 illustrates a cross-sectional view taken along line I-I' of FIG. 3, showing a semiconductor memory device according to exemplary embodiments of inventive concepts.

FIG. 7 illustrates a cross-sectional view taken along line I-I' of FIG. 3, showing a semiconductor memory device according to exemplary embodiments of inventive concepts. For brevity of description, those components the same as those discussed in the semiconductor memory device according to exemplary embodiments of inventive concepts are allocated the same reference numerals thereto, and a repetitive explanation thereof will be omitted.

Referring to FIG. 7, the vertical channels VC, the charge storage structures 310, and the gap-fill layers 320 may contact the top surface of the second substrate 200. The vertical supporters PSS may contact the top surface of the second substrate 200. For example, this exemplary embodiment may not include the semiconductor pillars SP and the vertical pillars 409 discussed above with reference to FIGS. 4 and 5.

Figure 8:
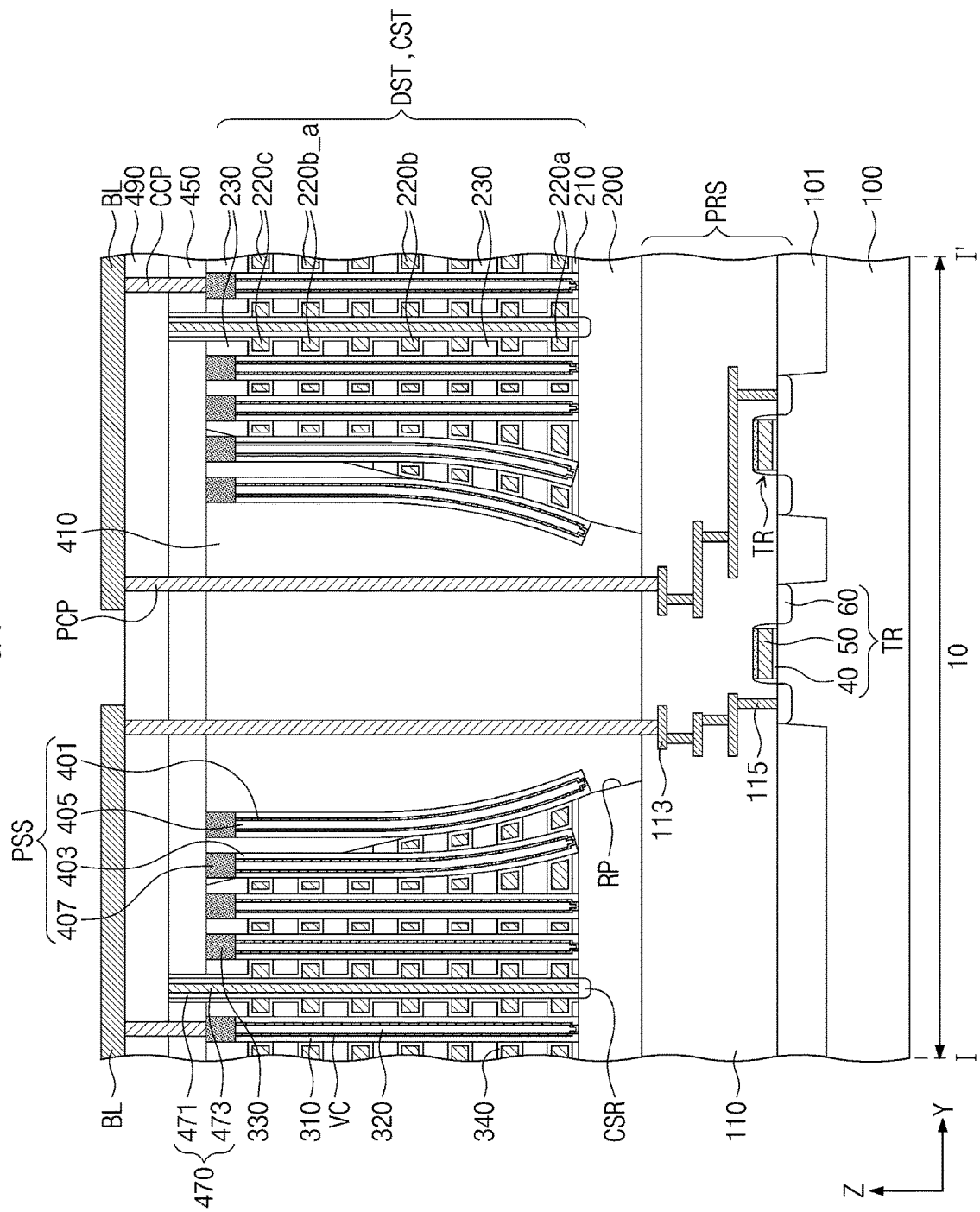
FIG. 8 illustrates a cross-sectional view taken along line I-I' of FIG. 3, showing a semiconductor memory device according to exemplary embodiments of inventive concepts.

FIG. 8 illustrates a cross-sectional view taken along line I-I' of FIG. 3, showing a semiconductor memory device according to exemplary embodiments of inventive concepts. For brevity of description, those components the same as those discussed in the semiconductor memory device according to exemplary embodiments of inventive concepts are allocated the same reference numerals thereto, and a repetitive explanation thereof will be omitted.

Referring to FIG. 8, the vertical channels VC may have sidewalls that are substantially perpendicular to the top surface of the first substrate 100. The vertical supporters PSS may have lower portions that are disposed between the second substrate 200 and a lowermost cell gate electrode 220b, and the lower portions of the vertical supporters PSS may be curved toward the recess part RP. Accordingly, lower outer walls of the vertical supporters PSS may be sloped at an acute or obtuse angle relative to the top surface of the first substrate 100. The vertical supporters PSS may have lower portions that are adjacent to the recess part RP, and the lower portions of the vertical supporters PSS may extend onto the side surface of the second substrate 200 exposed to the recess part RP. In this exemplary embodiment, the vertical supporters PSS may be spaced part from the first interlayer dielectric layer 110 of the peripheral circuit structure PRS. For example, the first vertical layers 401 may be spaced apart from the first interlayer dielectric layer 110.

Figure 9A:
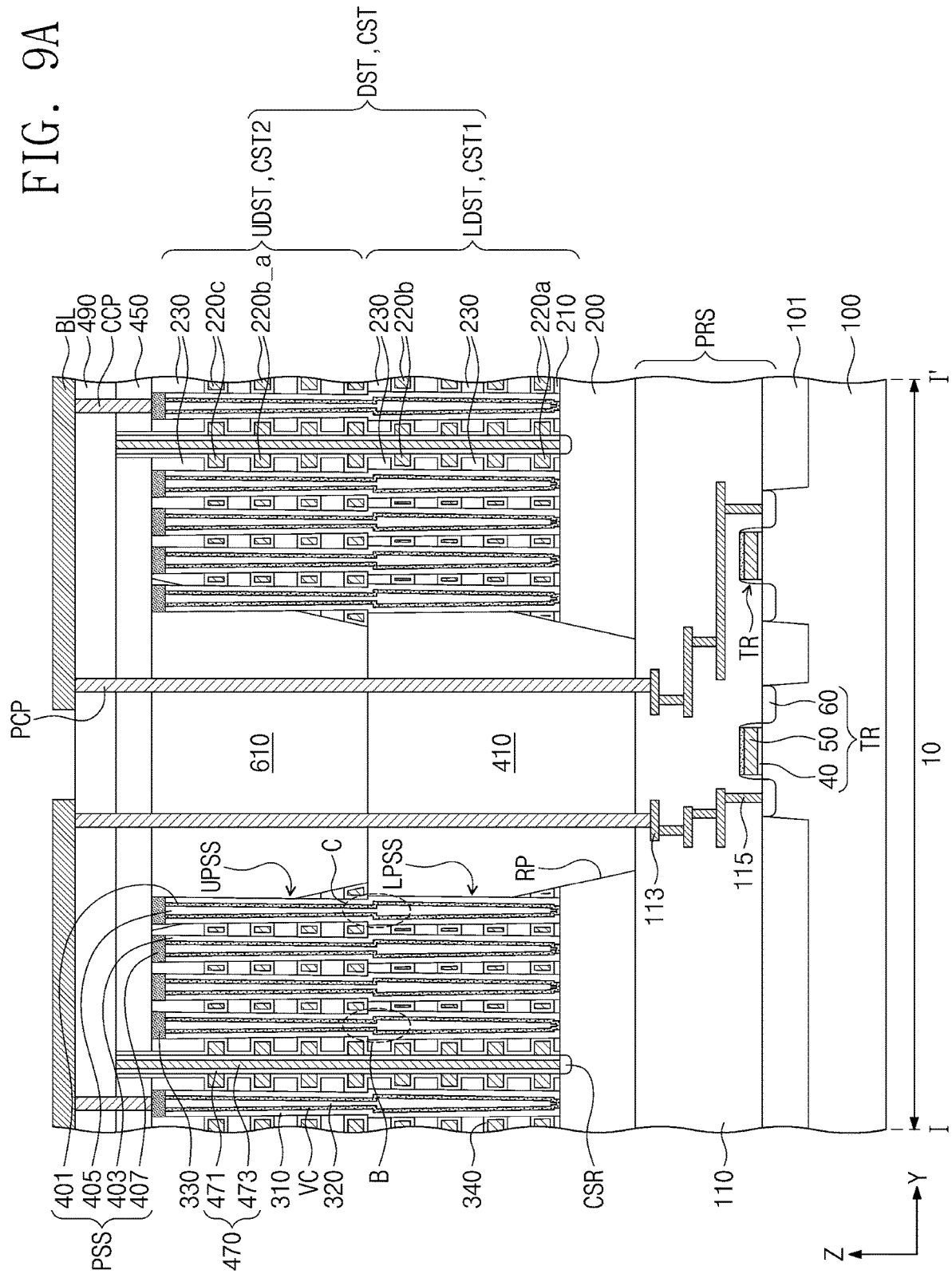
FIG. 9A illustrates a cross-sectional view taken along line I-I' of FIG. 3, showing a semiconductor memory device according to exemplary embodiments of inventive concepts.
Figure 9B:
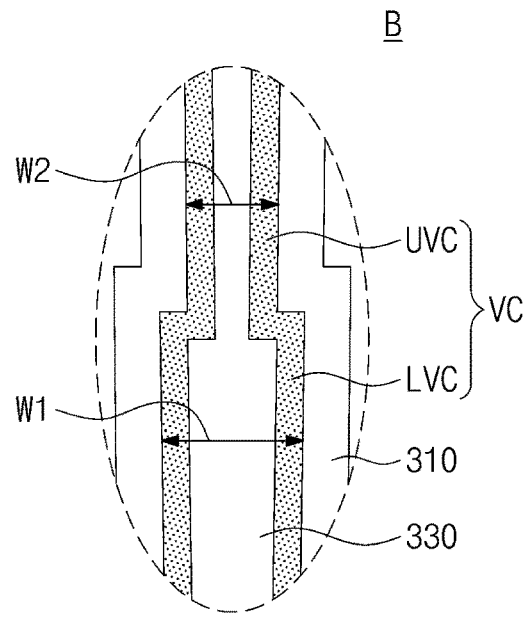
FIG. 9B illustrates an enlarged view showing section B of FIG. 9A.
Figure 9C:
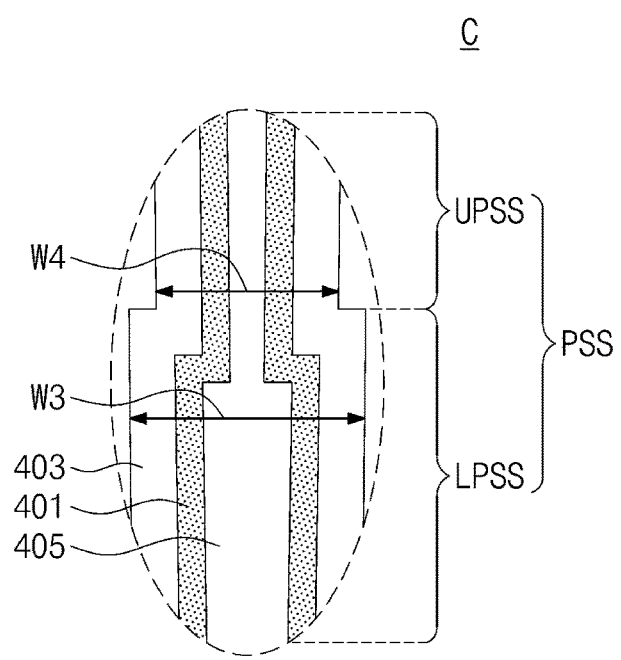
FIG. 9C illustrates an enlarged view showing section C of FIG. 9A.

FIG. 9A illustrates a cross-sectional view taken along line I-I' of FIG. 3, showing a semiconductor memory device according to exemplary embodiments of inventive concepts. FIG. 9B illustrates an enlarged view showing section B of FIG. 9A. FIG. 9C illustrates an enlarged view showing section C of FIG. 9A. For brevity of description, those components the same as those discussed in the semiconductor memory device according to exemplary embodiments of inventive concepts are allocated the same reference numerals thereto, and a repetitive explanation thereof will be omitted.

Referring to FIGS. 9A, 9B, and 9C, each of the dummy stack structures DST may include a lower dummy stack structure LDST and an upper dummy stack structure UDST on the lower dummy stack structure LDST. The lower and upper dummy stack structures LDST and UDST may vertically overlap each other. Each of the cell stack structures CST may include a first cell stack structure CST1 and a second cell stack structure CST2 on the first cell stack structure CST1. The first and second cell stack structures CST1 and CST2 may vertically overlap each other.

Each of the stack structures DST and CST may include the ground select gate electrode 220a, the string select gate electrode 220c, and the cell gate electrodes 220b and 220b_a. In an exemplary embodiment, the dummy stack structure DST may be configured in such a way that the ground select gate electrode 220a may correspond to a lowermost gate electrode of the lower dummy stack structure LDST, and that the string select gate electrode 220c may correspond to an uppermost gate electrode of the upper dummy stack structure UDST. In the dummy stack structure DST, the cell gate electrodes 220b and 220b_a may correspond to gate electrodes between the lowermost gate electrode of the lower dummy stack structure LDST and the uppermost gate electrode of the upper dummy stack structure UDST.

Similarly to that discussed above, the cell stack structure CST may be configured in such a way that the ground select gate electrode 220a may correspond to a lowermost gate electrode of the first cell stack structure CST1, and that the string select gate electrode 220c may correspond to an uppermost gate electrode of the second cell stack structure CST2. In the cell stack structure CST, the cell gate electrodes 220b and 220b_a may correspond to gate electrodes between the lowermost gate electrode of the first cell stack structure CST1 and the uppermost gate electrode of the second cell stack structure CST2.

On the cell array region 10 of the second substrate 200, a single first through dielectric pattern 410 may penetrate the lower dummy stack structures LDST of the dummy stack structures DST and also penetrate the second substrate 200. On the cell array region 10 of the second substrate 200, a single second through dielectric pattern 610 may penetrate the upper dummy stack structures UDST of the dummy stack structures DST. The first and second through dielectric patterns 410 and 610 may vertically overlap each other such that the uppermost surface of the first through dielectric pattern 410 is coplanar with the lowermost surface of the second through dielectric pattern 610. The second through dielectric pattern 610 may include, for example, high density plasma (HDP) oxide, tetraethylorthosilicate (TEOS), plasma enhanced tetraethylorthosilicate (PE-TEOS), O$_3$-tetratthylorthosilicate (O$_3$-TEOS), undoped silicate glass (USG), phosphosilicate glass (PSG), borosilicate glass (BSG), borophosphosilicate glass (BPSG), fluorosilicate glass (FSG), spin on glass (SOG), tonen silazene (TOSZ), or a combination thereof.

The lower dummy stack structures LDST may have sidewalls that contact the first through dielectric pattern 410 and are sloped relative to the top surface of the first substrate 100, and the upper dummy stack structures UDST may have sidewalls that contact the second through dielectric pattern 610 and are sloped relative to the top surface of the first substrate 100. In an exemplary embodiment, the second substrate 200 may have side surfaces that contact the first through dielectric pattern 410 and align with the sidewalls, which contact the first through dielectric pattern 410, of the lower dummy stack structures LDST. The upper dummy stack structures UDST may have sidewalls that contact the second through dielectric pattern 610 and misalign with the sidewalls, which contact the first through dielectric pattern 410, of the lower dummy stack structures LDST.

The vertical channels VC may penetrate the stack structures DST and CST. Each of the vertical channels VC may include a lower channel LVC and an upper channel UVC. The lower channel LVC may penetrate the lower dummy stack structures LDST and the first cell stack structures CST1. The upper channel UVC may penetrate the upper dummy stack structures UDST and the second cell stack structures CST2.

In an exemplary embodiment, the lower channel LVC may have a width in a direction parallel to the top surface of the substrate 100 that may gradually decrease in a downward vertical direction towards the top surface of the substrate 100. For example, the lower channel LVC may have an upper width W1 in a direction parallel to the top surface of the substrate 100 and a lower width in the direction parallel to the top surface of the substrate 100 less than the upper width W1. In an exemplary embodiment, the upper width W1 of the lower channel LVC is relatively closer to the contact surface of the uppermost surface of the first through dielectric pattern 410 and the lowermost surface of the second through dielectric pattern 610 with respect to the lower width of the lower channel LVC and the lower width of the lower channel LVC is relatively closer to the top surface of the second substrate 200 with respect to the upper width W1 of the lower channel LVC. In an exemplary embodiment, the upper channel UVC may have a width in a direction parallel to the top surface of the substrate 100 that may gradually increase in an upward vertical direction towards the bottom surface of the second interlayer dielectric layer 450. For example, the upper channel UVC may have an upper width in the direction parallel to the top surface of the substrate 100 and a lower width W2 in the direction parallel to the top surface of the substrate 100 less than the upper width. In an exemplary embodiment, the lower width W2 of the upper channel UVC is relatively closer to the contact surface of the uppermost surface of the first through dielectric pattern 410 and the lowermost surface of the second through dielectric pattern 610 with respect to the upper width of the upper channel UVC and the upper width of the upper channel UVC is relatively closer to the bottom surface of the second interlayer dielectric layer 450 with respect to the lower width W2 of the upper channel UVC. In an exemplary embodiment, the upper width W1 of the lower channel LVC may be greater than the lower width W2 of the upper channel UVC (W1>W2). The vertical channels VC may thus have a partially crooked (e.g., bent) sidewall.

On the top surface of the second substrate 200, the vertical supporters PSS may penetrate the lower dummy stack structures LDST, the second segment P2 of the first through dielectric pattern 410, the upper dummy stack structures UDST, and the second through dielectric pattern 610.

Each of the vertical supporters PSS may include a lower supporter LPSS and an upper supporter UPSS. The lower supporter LPSS may penetrate the lower dummy stack structures LDST and the first through dielectric pattern 410, and the upper supporter UPSS may penetrate the upper dummy stack structures UDST and the second through dielectric pattern 610. In an exemplary embodiment, the lower supporter LPSS may have a width in a direction parallel to the top surface of the substrate 100 that may gradually decrease in a downward vertical direction towards the top surface of the substrate 100. For example, the lower supporter LPSS may have an upper width W3 in a direction parallel to the top surface of the substrate 100 and a lower width in the direction parallel to the top surface of the substrate 100 less than the upper width W3. In an exemplary embodiment, the upper width W3 of the lower supporter LPSS is relatively closer to the contact surface of the uppermost surface of the first through dielectric pattern 410 and the lowermost surface of the second through dielectric pattern 610 with respect to the lower width of the lower supporter LPSS and the lower width of the lower supporter LPSS is relatively closer to the top surface of the second substrate 200 with respect to the upper width W3 of the lower supporter LPSS. In an exemplary embodiment, the upper supporter UPSS may have a width in a direction parallel to the top surface of the substrate 100 that may gradually increase in an upward vertical direction towards the bottom surface of the second interlayer dielectric layer 450. For example, the upper supporter UPSS may have an upper width in the direction parallel to the top surface of the substrate 100 and a lower width W4 in the direction parallel to the top surface of the substrate 100 less than the upper width. In an exemplary embodiment, the lower width W4 of the upper supporter UPSS is relatively closer to the contact surface of the uppermost surface of the first through dielectric pattern 410 and the lowermost surface of the second through dielectric pattern 610 with respect to the upper width of the upper supporter UPSS and the upper width of the upper supporter UPSS is relatively closer to the bottom surface of the second interlayer dielectric layer 450 with respect to the lower width W4 of the upper supporter UPSS. In an exemplary embodiment, the upper width W3 of the lower supporter LPSS may be greater than the lower width W4 of the upper supporter UPSS (W3>W4). The vertical supporters PSS may thus have a partially crooked (e.g., bent) sidewall.

The peripheral contact plugs PCP disposed on the cell array region 10 of the second substrate 200 may penetrate the first segment (see P1 of FIG. 3) of the first through dielectric pattern 410, the second through dielectric pattern 610, the second interlayer dielectric layer 450, and the third interlayer dielectric layer 490.

Figure 10:
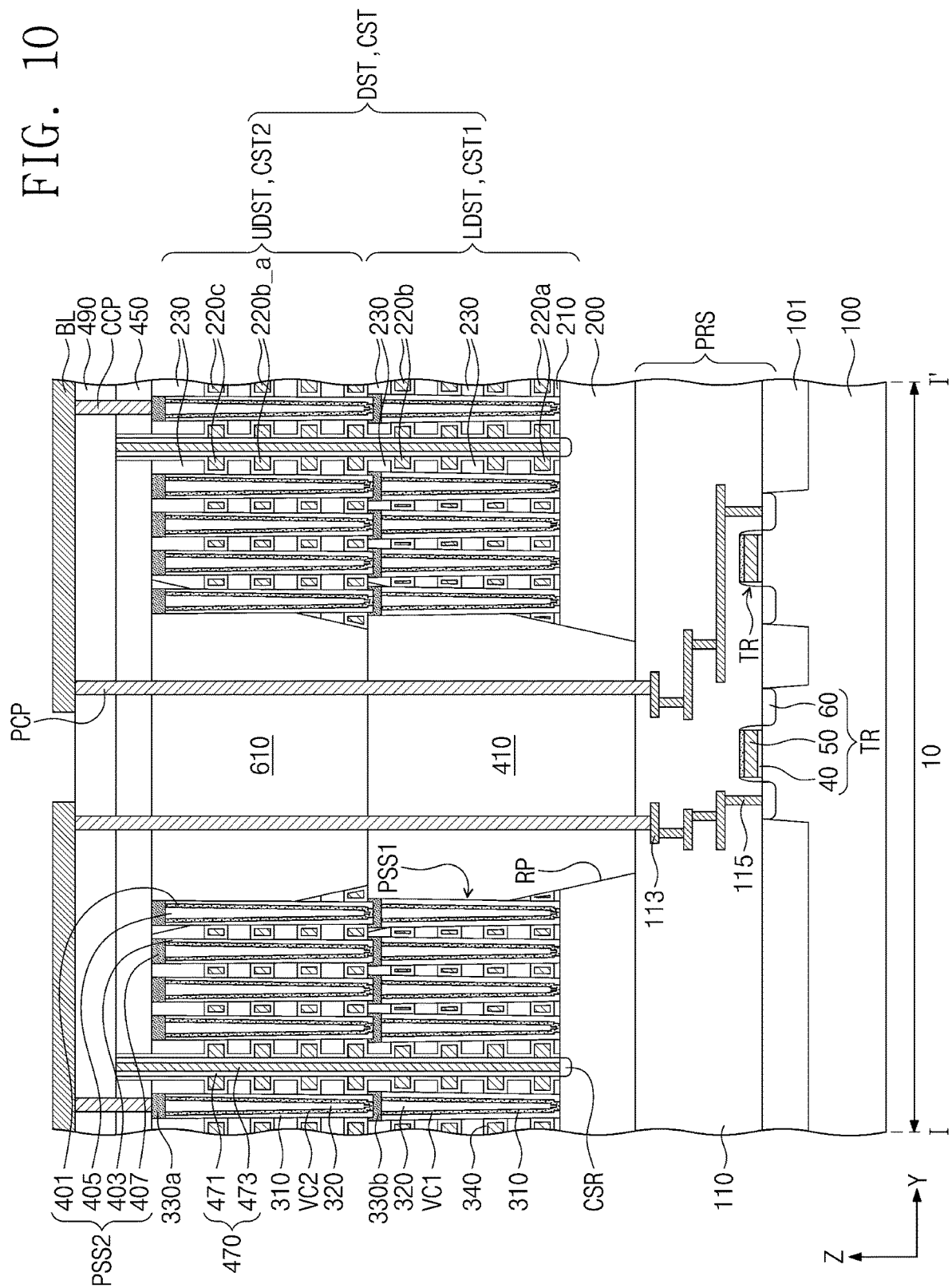
FIG. 10 illustrates a cross-sectional view taken along line I-I' of FIG. 3, showing a semiconductor memory device according to exemplary embodiments of inventive concepts.

FIG. 10 illustrates a cross-sectional view taken along line I-I' of FIG. 3, showing a semiconductor memory device according to exemplary embodiments of inventive concepts. For brevity of description, those components the same as those discussed in the semiconductor memory device according to exemplary embodiments of inventive concepts are allocated the same reference numerals thereto, and a repetitive explanation thereof will be omitted.

Referring to FIG. 10, first vertical supporters PSS1 may be provided in the lower dummy stack structures LDST disposed on the cell array region 10 of the second substrate 200. Second vertical supporters PSS2 may be provided in the upper dummy stack structures UDST disposed on the cell array region 10 of the second substrate 200. The first vertical supporters PSS1 may vertically overlap the second vertical supporters PSS2. In an exemplary embodiment, the capping patterns 407 of the first vertical supporters PSS1 may contact lower portions of the second vertical supporters PSS2.

In the dummy stack structures DST, the first vertical supporters PSS1 may penetrate the ground select gate electrodes 220a and the cell gate electrodes 220b and 220b_a of the lower dummy stack structures LDST. In the dummy stack structures DST, the second vertical supporters PSS2 may penetrate the string select gate electrodes 220c and the cell gate electrodes 220b and 220b_a of the upper dummy stack structures UDST.

First vertical channels VC1 may be provided in the first cell stack structures CST1 disposed on the cell array region 10 of the second substrate 200. Second vertical channels VC2 may be provided in the second cell stack structures CST2 disposed on the cell array region 10 of the second substrate 200. The first vertical channels VC1 may vertically overlap the second vertical channels VC2.

In the cell stack structures CST, the first vertical channels VC1 may penetrate the ground select gate electrodes 220a and the cell gate electrodes 220b and 220b_a of the first cell stack structures CST1. In the cell stack structures CST, the second vertical channels VC2 may penetrate the string select gate electrodes 220c and the cell gate electrodes 220b and 220b_a of the second cell stack structures CST2.

First pads 330a may be disposed on upper portions of the first vertical channels VC1, and second pads 330b may be disposed on upper portions of the second vertical channels VC2. The first vertical channels VC1 may have lower portions in contact with the second substrate 200, and the second vertical channels VC2 may have lower portions in contact with the second pads 330b.

Figure 11:
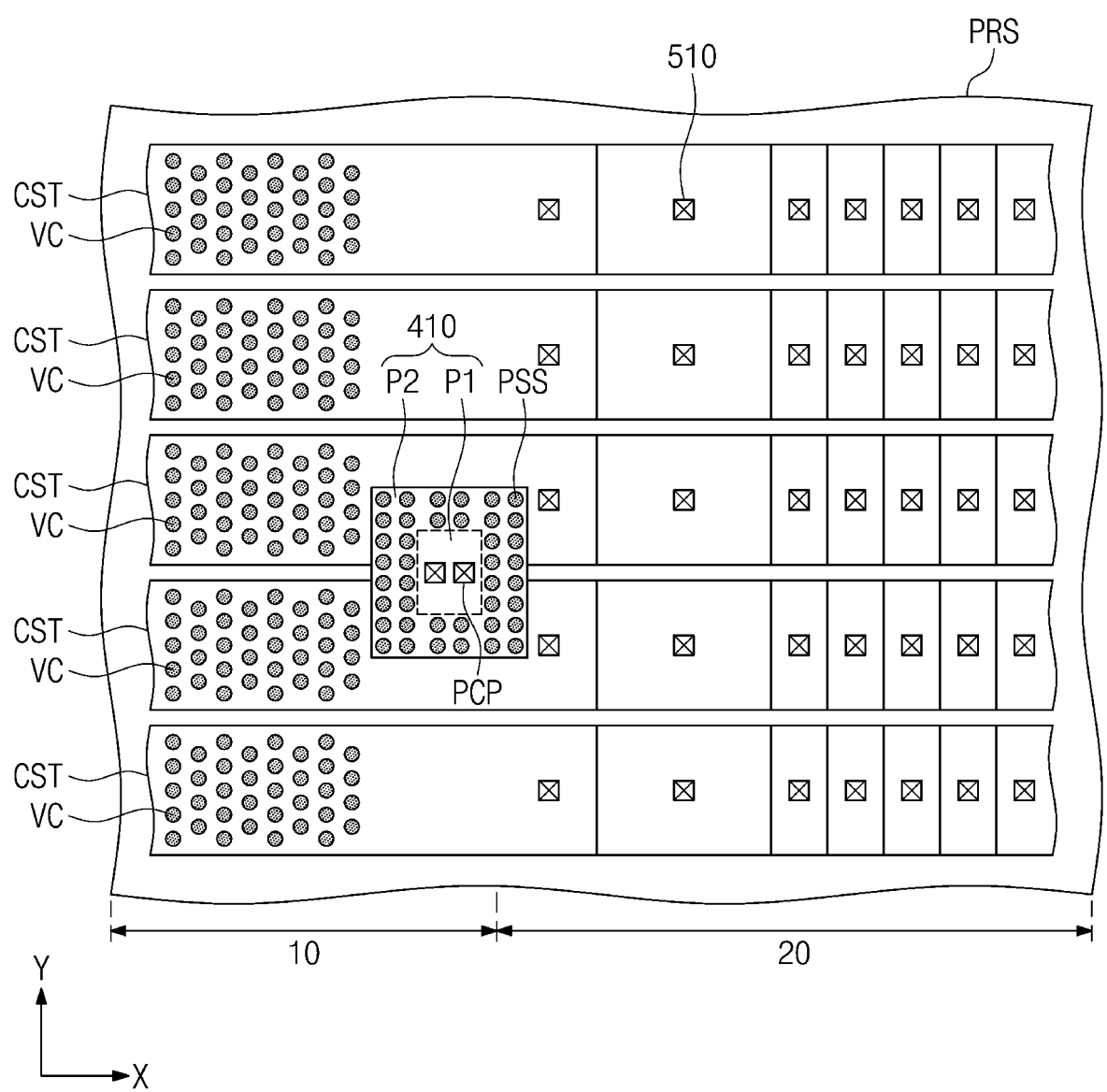
FIG. 11 illustrates a plan view showing a semiconductor memory device according to exemplary embodiments of inventive concepts.

FIG. 11 illustrates a plan view showing a semiconductor memory device according to exemplary embodiments of inventive concepts. For brevity of description, those components the same as those discussed in the semiconductor memory device according to exemplary embodiments of inventive concepts are allocated the same reference numerals thereto, and a repetitive explanation thereof will be omitted.

Referring to FIG. 11, on the cell array region 10 of the second substrate 200, the through dielectric pattern 410 may penetrate a pair of cell stack structures CST and the second substrate (see 200 of FIG. 4). The through dielectric pattern 410 may be surrounded by the pair of cell stack structures CST. The vertical channels VC disposed in the pair of cell stack structures CST may be spaced apart from the through dielectric pattern 410. Although not shown in figures, the channel contact plugs (see CCP of FIG. 4) may be provided on the vertical channels VC disposed in the pair of cell stack structures CST. In this exemplary embodiment, the vertical channels VC may be connected to the bit lines BL. Although the present embodiment shows only one pair of cell stack structures CST, the number of pairs of cell stack structures CST is not limited thereto.

Figure 13:
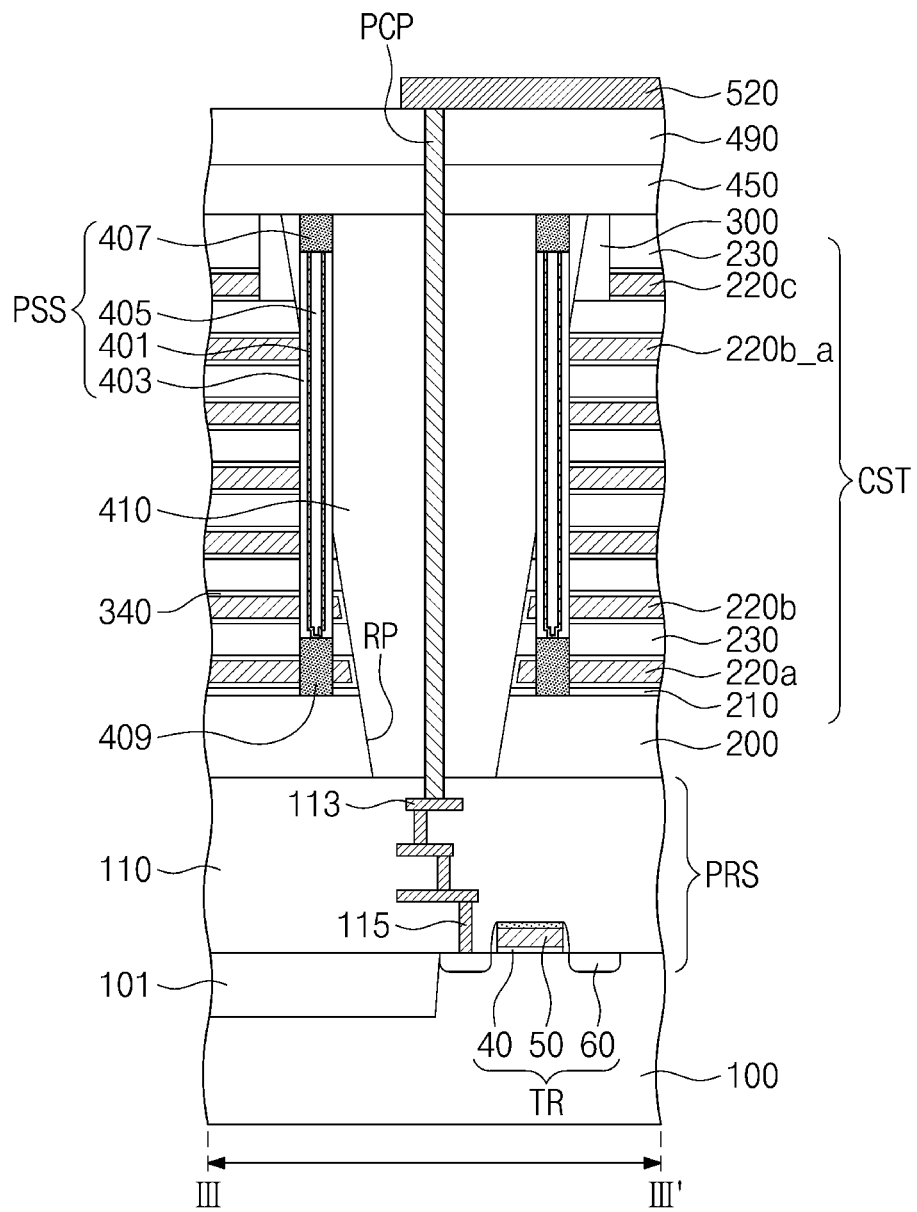
FIG. 13 illustrates a cross-sectional view taken along line of FIG. 12, showing a semiconductor memory device according to exemplary embodiments of inventive concepts.

FIG. 12 illustrates a plan view showing a semiconductor memory device according to exemplary embodiments of inventive concepts. FIG. 13 illustrates a cross-sectional view taken along line of FIG. 12, showing a semiconductor memory device according to exemplary embodiments of inventive concepts. For brevity of description, those components the same as those discussed in the semiconductor memory device according to exemplary embodiments of inventive concepts are allocated the same reference numerals thereto, and a repetitive explanation thereof will be omitted.

Referring to FIGS. 12 and 13, the through dielectric pattern 410 may be disposed on the pad region 20 of the second substrate 200. The through dielectric pattern 410 may penetrate the interlayer dielectric pattern 300 disposed on the pad region 20 of the second substrate 200, a pair of cell stack structures CST, and the second substrate 200. In an exemplary embodiment, the through dielectric pattern 410 may be surrounded by the pair of cell stack structures CST. In an exemplary embodiment, when viewed in plan, a single through dielectric pattern 410 may be disposed locally on the ends of the uppermost cell gate electrodes 220b_a of the pair of cell stack structures CST. The cell contact plugs 510 may not be provided on the ends of the uppermost cell gate electrodes 220b_a of the pair of cell stack structures CST.

Although not shown in figures, the peripheral contact plugs PCP may be electrically coupled to the connection lines 520 connected to the cell contact plugs 510. In an exemplary embodiment, the transistors TR connected to the peripheral contact plugs PCP may provide signals through the connection lines 520 to the select transistors SST and GST, the memory cells MCT, and the dummy cell DMC discussed above with reference to FIG. 2. Although not shown in figures, the channel contact plugs (see CCP of FIG. 4) may be provided on the vertical channels VC disposed in the pair of cell stack structures CST. In this exemplary embodiment, the vertical channels VC may be connected to the bit lines BL.

FIG. 14 illustrates a plan view showing a semiconductor memory device according to exemplary embodiments of inventive concepts.

Referring to FIG. 14, on the cell array region 10 of the second substrate 200, the first through dielectric pattern 410 may penetrate the dummy stack structures DST and the second substrate 200. On the pad region 20 of the second substrate 200, the second through dielectric pattern 610 may penetrate the interlayer dielectric pattern 300, the dummy stack structures DST, and the second substrate 200. In an exemplary embodiment, when viewed in plan, a single second through dielectric pattern 610 may be disposed locally on the ends of the uppermost cell gate electrodes 220b_a of a plurality of dummy stack structures DST. For example, the second through dielectric pattern 610 may penetrate the third dummy stack structure DST3, while running in the second direction Y across the third dummy stack structure DST3. The second through dielectric pattern 610 may penetrate the first and second dummy stack structures DST1 and DST2, while partially running across the first and second dummy stack structures DST1 and DST2. The second through dielectric pattern 610 may divide the third dummy stack structure DST3 into a plurality of pieces in the first direction X.

In an exemplary embodiment, the second substrate 200 may have the recess parts (see RP of FIG. 4). The recess parts RP may be disposed in the cell array region 10 and the pad region 20 of the second substrate 200. The recess parts RP may be sections where the first and second through dielectric patterns 410 and 610 penetrate the second substrate 200. The recess parts RP may partially expose a top surface of the first interlayer dielectric layer 110. The first and second through dielectric patterns 410 and 610 may contact the first interlayer dielectric layer 110 exposed to the recess parts RP.

On the top surface of the second substrate 200, the first vertical supporters PSS1 may penetrate the first through dielectric pattern 410 and the dummy stack structures DST. On the top surface of the second substrate 200, the second vertical supporters PSS2 may penetrate the second through dielectric pattern 610 and the dummy stack structures DST. The first and second vertical supporters PSS1 and PSS2 may contact the second substrate 200. The first vertical supporters PSS1 may be arranged along the second segment P2 of the first through dielectric pattern 410, and the second vertical supporters PSS2 may be arranged along the second segment P2 of the second through dielectric pattern 610.

When viewed in plan, the first vertical supporters PSS1 may surround the first segment P1 of the first through dielectric pattern 410, and the second vertical supporters PSS2 may surround the first segment P1 of the second through dielectric pattern 610.

FIGS. 15A, 16, 17, 18A, 19A, and 20 illustrate cross-sectional views taken along line I-I' of FIG. 3, showing a method of fabricating a semiconductor memory device according to exemplary embodiments of inventive concepts. FIGS. 15B, 18B, and 19B illustrate cross-sectional views taken along line II-IF of FIG. 3, showing a method of fabricating a semiconductor memory device according to exemplary embodiments of inventive concepts.

Figure 15A:
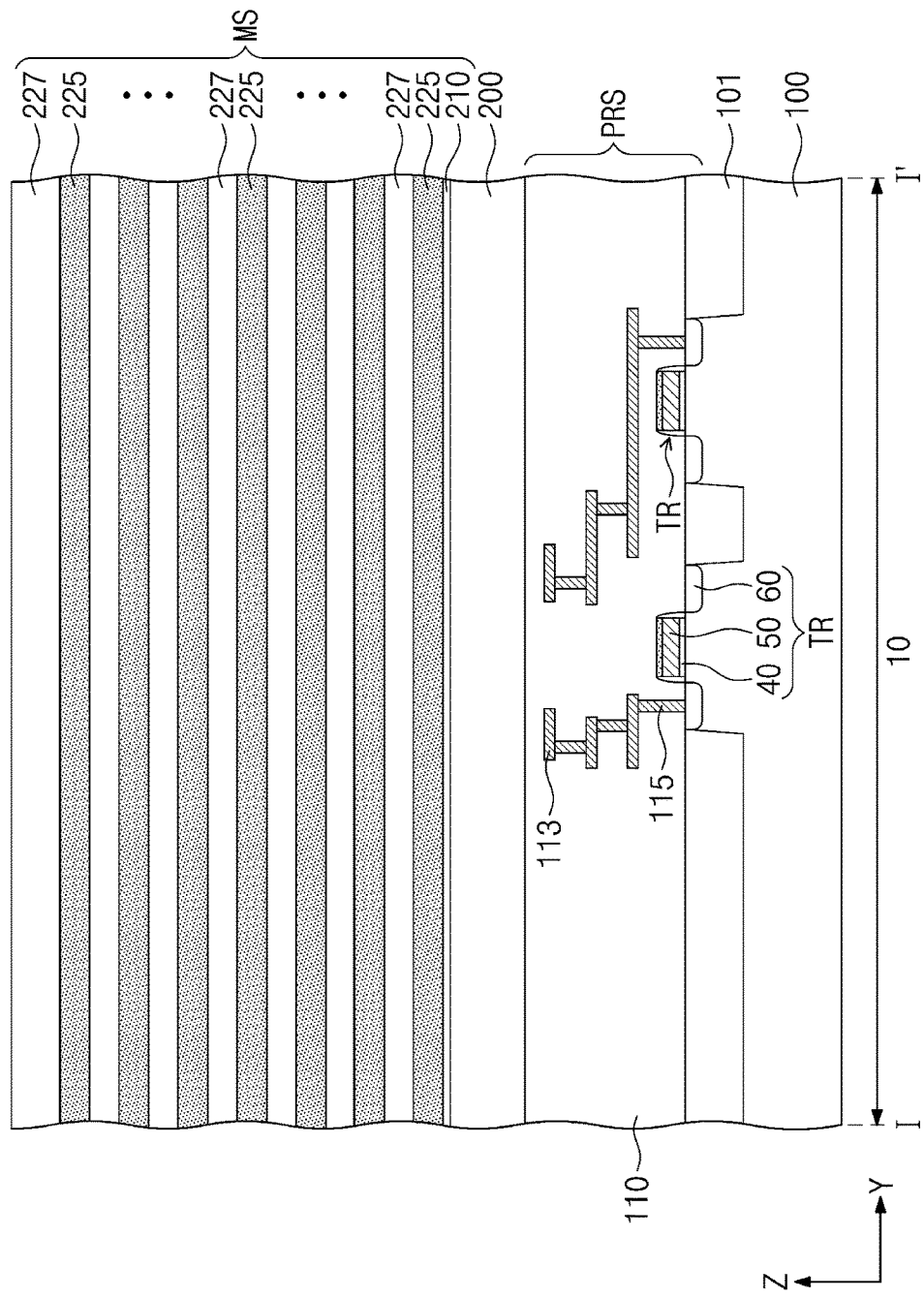
FIGS. 15A, 16, 17, 18A, 19A, and 20 illustrate cross-sectional views taken along line I-I' of FIG. 3, showing a method of fabricating a semiconductor memory device according to exemplary embodiments of inventive concepts.
Figure 15B:
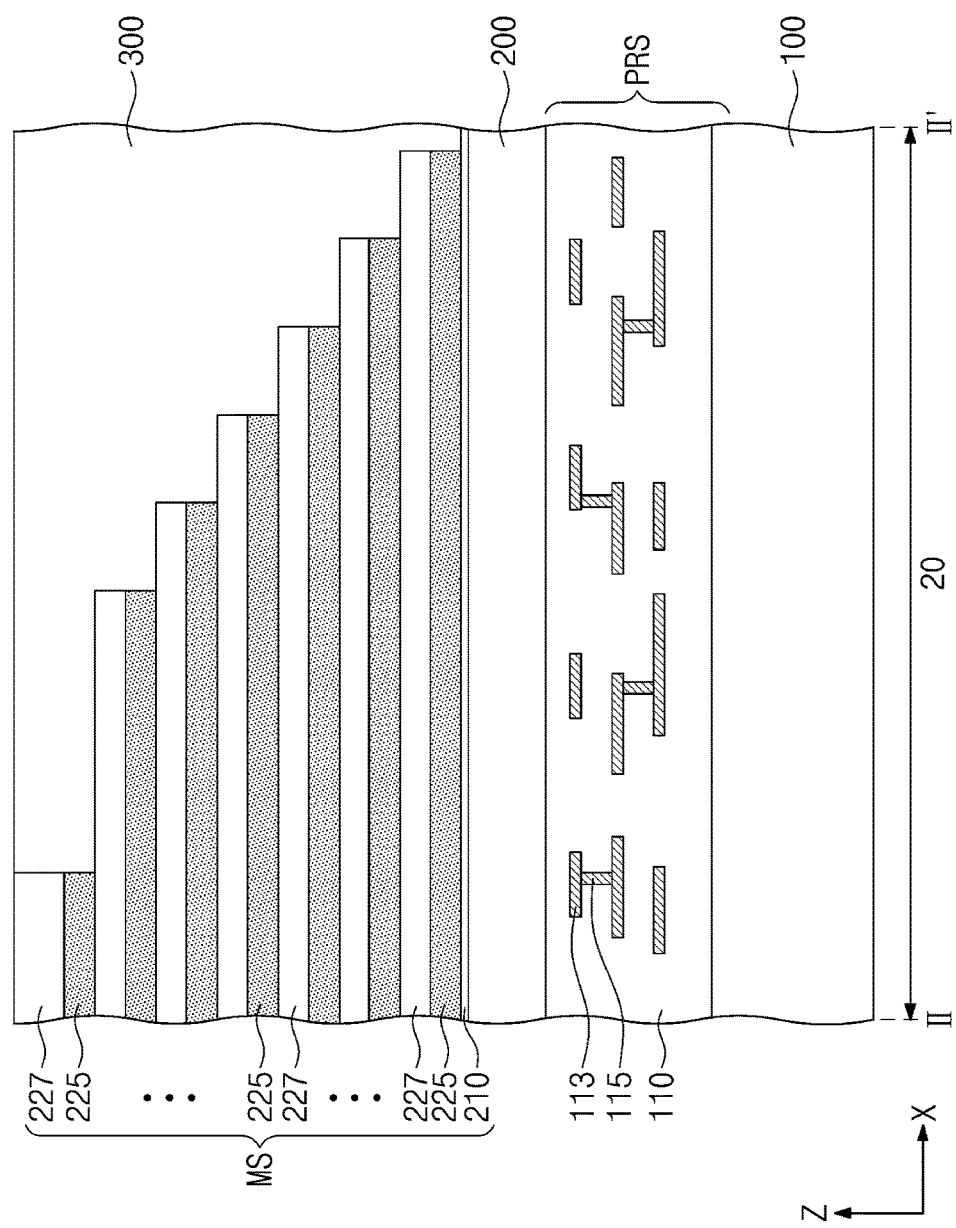
FIGS. 15B, 18B, and 19B illustrate cross-sectional views taken along line II-IF of FIG. 3, showing a method of fabricating a semiconductor memory device according to exemplary embodiments of inventive concepts.

Referring to FIGS. 15A and 15B, a device isolation layer 101 may be formed in a first substrate 100. The device isolation layer 101 may define active regions of the first substrate 100.

A peripheral circuit structure PRS may be provided on the first substrate 100. The peripheral circuit structure PRS may include transistors TR, wiring lines 113, vias 115, and a first interlayer dielectric layer 110. The transistors TR may be formed on the active regions of the first substrate 100. The transistors TR may include a peripheral gate dielectric layer 40, a peripheral gate electrode 50, and source/drain regions 60. The peripheral gate dielectric layer 40 and the peripheral gate electrode 50 may be sequentially formed on the first substrate 100. The source/drain regions 60 may be formed in the active regions of the first substrate 100 on opposite sides of the peripheral gate electrode 50.

The first interlayer dielectric layer 110 may be formed on the first substrate 100. The first interlayer dielectric layer 110 may be formed to cover the transistors TR. The first interlayer dielectric layer 110 may include, for example, a silicon oxide layer. The wiring lines 113 and the vias 115 may be formed in the first interlayer dielectric layer 110.

A second substrate 200 may be provided on the peripheral circuit structure PRS. The second substrate 200 may include a cell array region 10 and a pad region 20.

A mold structure MS may be formed on the second substrate 200. The formation of the mold structure MS may include forming a buffer oxide layer 210 on the second substrate 200, and then alternately and repeatedly stacking sacrificial layers 225 and insulating layers 227 on the buffer oxide layer 210. The buffer oxide layer 210 may include, for example, a thermal oxide layer or a silicon oxide layer. The sacrificial layers 225 may include, for example, a silicon nitride layer. The insulating layers 227 may be formed of a material exhibiting an etch selectivity to the sacrificial layers 225. The insulating layer 227 may include, for example, a silicon oxide layer.

The mold structure MS may be patterned to have a stepwise structure on the pad region 20 of the second substrate 200. The patterning of the mold structure MS may include forming on the mold structure MS a mask pattern (not shown) exposing a portion of the mold structure MS, which portion is formed on the pad region 20 of the second substrate 200, and then repeatedly performing both an etching process in which the mask pattern is used as an etching mask to etch the insulating layers 227 and the sacrificial layers 225 and a process in which a width of the mask pattern is reduced to increase etching-target planar areas of the insulating layers 227 and the sacrificial layers 225. On the pad region 20 of the second substrate 200, the buffer oxide layer 210 may be exposed by the mold structure MS. In addition, on the pad region 20 of the second substrate 200, ends of the insulating layers 227 may be exposed on their top surfaces. The sacrificial layers 225 may have lengths in a first direction X that decrease with increasing distance from the second substrate 200, and the insulating layers 227 may have lengths in the first direction X that decrease with increasing distance from the second substrate 200. A pair of the sacrificial layer 225 and the insulating layer 227 vertically adjacent to each other may have the same length in the first direction X.

An interlayer dielectric pattern 300 may be formed to cover the stepwise structure of the mold structure MS and the buffer oxide layer 210. The interlayer dielectric pattern 300 may expose a top surface of the mold structure MS. The interlayer dielectric pattern 300 may include, for example, a tetraethylorthosilicate (TEOS) oxide layer.

Figure 16:
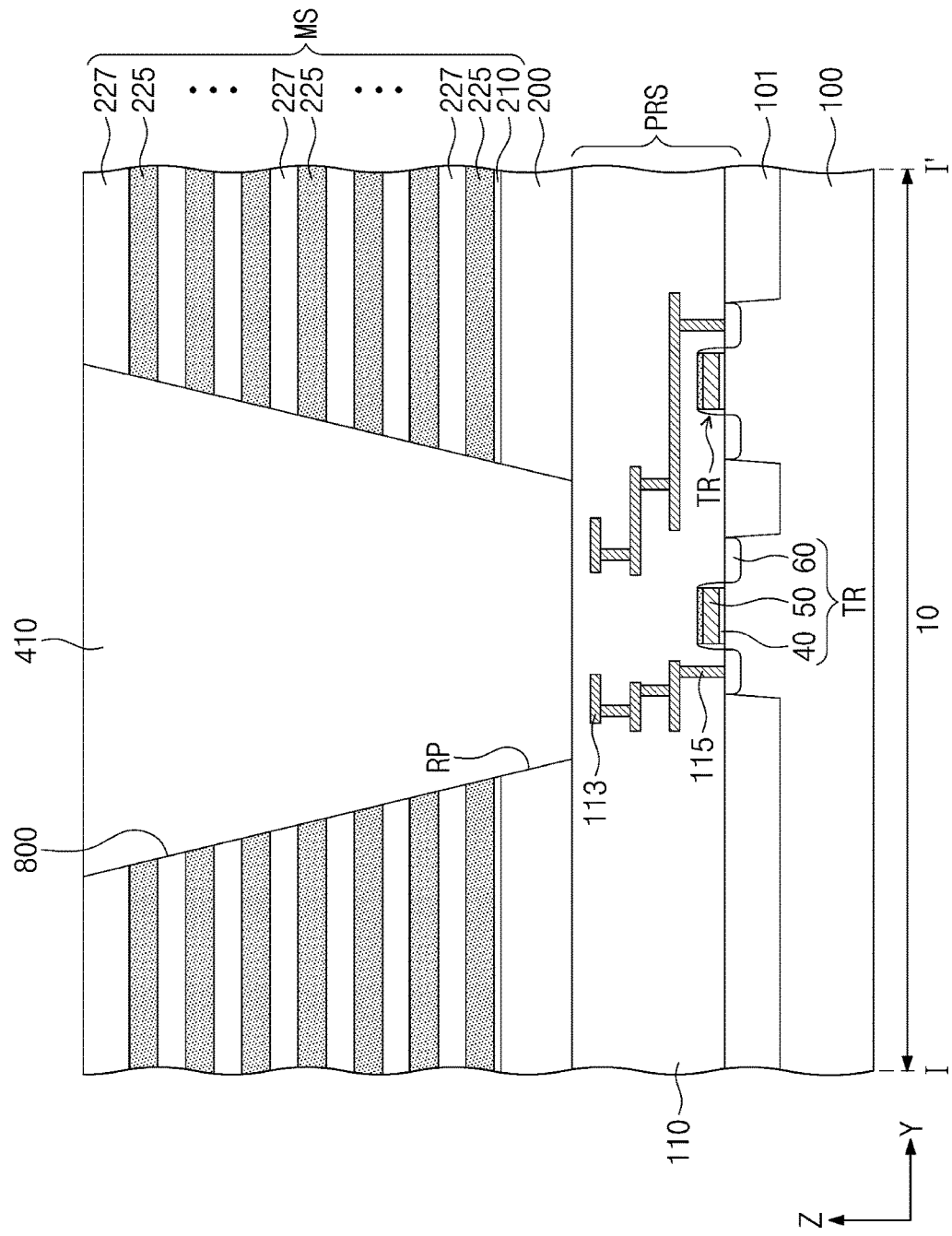

Referring to FIG. 16, a through hole 800 may be formed in the mold structure MS, and a recess part RP may be formed in the second substrate 200. The formation of the through hole 800 and the recess part RP may include forming on the mold structure MS a mask pattern (not shown) having an opening, and then using the mask pattern as an etching mask to anisotropically etch the mold structure MS and the second substrate 200. The recess part RP and the through hole 800 may vertically overlap each other and may be spatially connected to each other. The recess part RP and the through hole 800 may have their sidewalls aligned with each other, and the aligned sidewalls of the recess part RP and the through hole 800 may be sloped relative to a top surface of the first substrate 100. The through hole 800 may have a lower width greater than an upper width of the recess part RP.

A through dielectric pattern 410 may be formed to fill the through hole 800 and the recess part RP. The formation of the through dielectric pattern 410 may include filling an insulating material into the through hole 800 and the recess part RP, and then performing a planarization process on the insulating material so as to expose the top surface of the mold structure MS. The through dielectric pattern 410 may include, for example, a silicon oxide layer.

Figure 17:
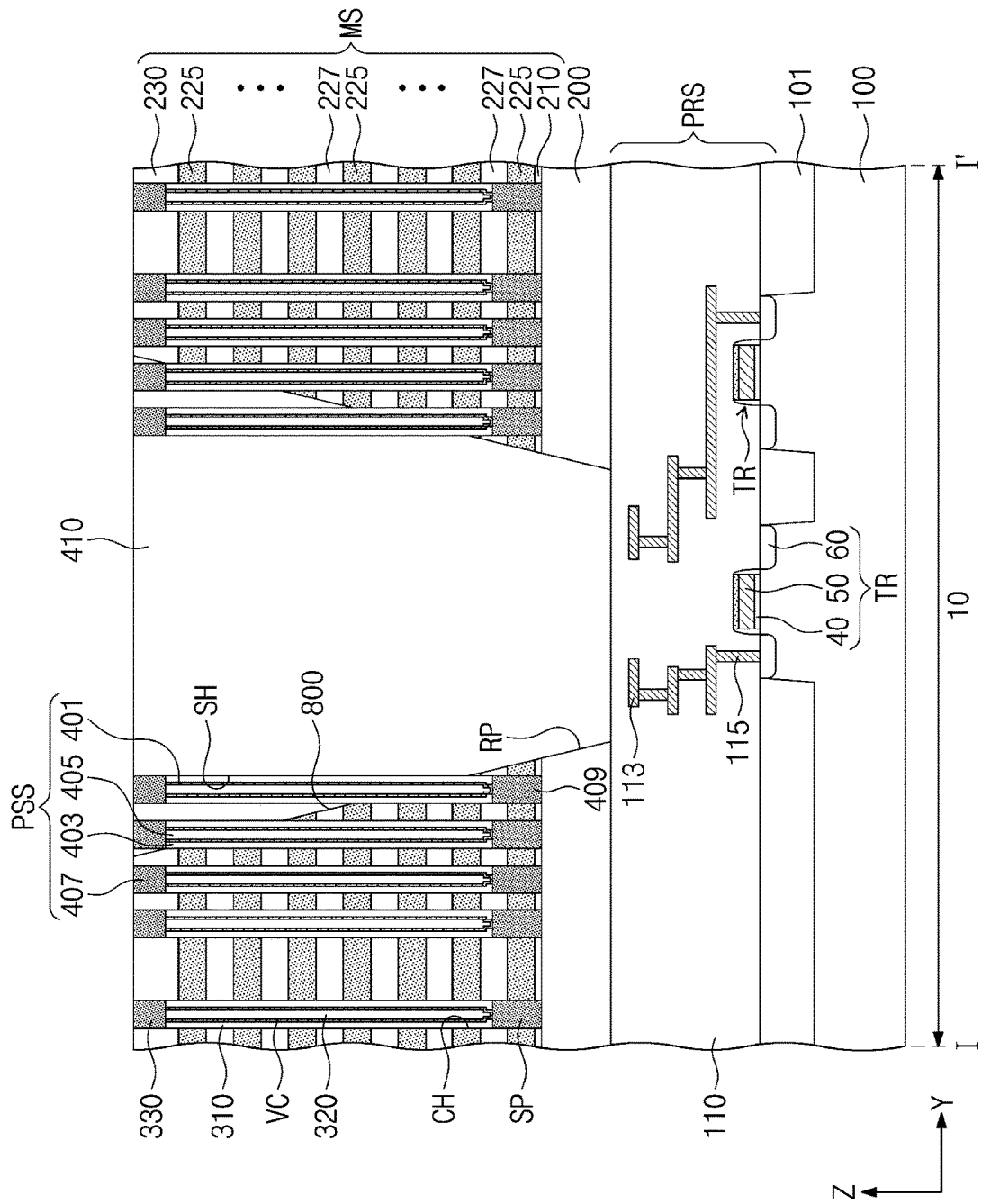

Referring to FIG. 17, the mold structure MS and the buffer oxide layer 210 may be patterned to form channel holes CH and support holes SH on the cell array region 10 of the second substrate 200. For example, the formation of the channel holes CH may include forming a mask pattern (not shown) on the mold structure MS and the interlayer dielectric pattern 300, and then using the mask pattern as an etching mask to anisotropically etch the mold structure MS and the buffer oxide layer 210. The formation of the support holes SH may include forming a mask pattern (not shown) on the mold structure MS and the interlayer dielectric pattern 300, and then using the mask pattern as an etching mask to anisotropically etch the mold structure MS, the through dielectric pattern 410, and the buffer oxide layer 210. In an exemplary embodiment, the channel holes CH and the support holes SH may be simultaneously formed in the same etching process. An over-etching action may be carried out such that the second substrate 200 may be recessed on its top surface. When viewed in plan, the channel holes CH and the support holes SH may have a circular shape, an oval shape, or a polygonal shape, but the disclosure is not limited thereto.

In an exemplary embodiment, the support holes SH may be formed to have lower sidewalls that are not perpendicular to the top surface of the first substrate 100, which situation may primarily occur on an edge of a semiconductor wafer. For example, the support holes SH may be formed to have lower portions whose sidewalls are curved toward the recess part RP. In addition, at least one of the support holes SH may be formed to extend onto a side surface of the second substrate 200, which side surface is exposed to the recess part RP. Accordingly, as shown in FIG. 8, first, second, and third vertical layers 401, 403, and 405 that are expected to be formed in the support holes SH may have their lower portions that are curved toward the side surface of the second substrate 200.

Semiconductor pillars SP may be formed in the channel holes CH, and vertical pillars 409 may be formed in the support holes SH. The semiconductor pillars SP and the vertical pillars 409 may be formed by a selective epitaxial growth process in which the second substrate 200 exposed to the channel holes CH and the support holes SH is used as a seed layer from which the semiconductor pillars SP and the vertical pillars 409 are grown. The semiconductor pillars SP and the vertical pillars 409 may include a material whose directionality is the same as that of the second substrate 200. In an exemplary embodiment, the semiconductor pillars SP and the vertical pillars 409 may be simultaneously formed in the same epitaxial growth process.

Charge storage structures 310 may be formed on sidewalls of the channel holes CH, and second vertical layers 403 may be formed on sidewalls of the support holes SH. The charge storage structures 310 and the second vertical layers 403 may be simultaneously formed in the same deposition process. The charge storage structures 310 may cover the sidewalls of the channel holes CH, and also cover portions of the top surface of the second substrate 200 that are exposed to the channel holes CH. The second vertical layers 403 may cover the sidewalls of the support holes SH, and also cover portions of the top surface of the second substrate 200 that are exposed to the support holes SH.

Each of the charge storage structures 310 may include, as shown in FIG. 6, a blocking insulating layer BLL, a charge storage layer CTL, and a tunnel insulating layer TL that are sequentially formed on the sidewall of the channel hole CH. For example, the blocking insulating layer BLL may include a silicon oxide layer or a high-k dielectric layer (e.g., $Al_2O_3$ or $HfO_2$), the charge storage layer CTL may include a silicon nitride layer, and the tunnel insulating layer TL may include a silicon oxynitride layer or a high-k dielectric layer (e.g., $Al_2O_3$ or $HfO_2$).

Each of the second vertical layers 403 may include a first layer (not shown), a second layer (not shown), and a third layer (not shown) that are sequentially stacked on the sidewall of the support hole SH. The first layer may be formed of the same material composition as that of the blocking insulating layer BLL. The second layer may be formed of the same material composition as that of the charge storage layer CTL. The third layer may be formed of the same material composition as that of the tunnel insulating layer TL.

Vertical channels VC may be formed in the channel holes CH, and first vertical layers 401 may be formed in the support holes SH. The vertical channels VC and the first vertical layers 401 may be simultaneously formed in the same deposition process. The vertical channels VC may conformally cover inner walls of the charge storage structures 310 and the top surface of the second substrate 200 exposed by the charge storage structures 310. The first vertical layers 401 may conformally cover inner walls of the second vertical layers 403 and the top surface of the second substrate 200 exposed by the second vertical layers 403.

Gap-fill layers 320 may be formed in inner spaces surrounded by the vertical channels VC, and third vertical layers 405 may be formed in inner spaces surrounded by the first vertical layers 401. The gap-fill layers 320 may completely fill the channel holes CH, and the third vertical layers 405 may completely fill the support holes SH. In an exemplary embodiment, the gap-fill layers 320 and the third vertical layers 405 may be simultaneously formed in the same deposition process. An SOG technique may be used to form the gap-fill layers 320 and the third vertical layers 405. The gap-fill layers 320 and the third vertical layers 405 may include an insulating material, such as a silicon oxide layer. Prior to the formation of the gap-fill layers 320 and the third vertical layers 405, a hydrogen annealing process may further be performed to thermally treat the vertical channels VC under a gaseous atmosphere including hydrogen or deuterium. The hydrogen annealing process may cure crystalline defects present in the vertical channels VC.

Pads 330 may be formed on upper portions of the vertical channels VC, of the charge storage structures 310, and of the gap-fill layers 320, and capping patterns 407 may be formed on upper portions of the first, second, and third vertical layers 401, 403, and 405. The formation of the pads 330 may include forming recess regions by etching upper portions of the vertical channels VC, of the charge storage structures 310, and of the gap-fill layers 320, and then filling the recess regions with a conductive material. Alternatively, the pads 330 may be formed by doping the upper portions of the vertical channels VC with impurities whose conductivity is different from that of the vertical channels VC. In an exemplary embodiment, the capping patterns 407 and the pads 330 may be simultaneously formed in the same process. Each of the support holes SH may be provided therein with a vertical supporter PSS including the first, second, and third vertical layers 401, 403, and 405 and the capping pattern 407.

Figure 18A:
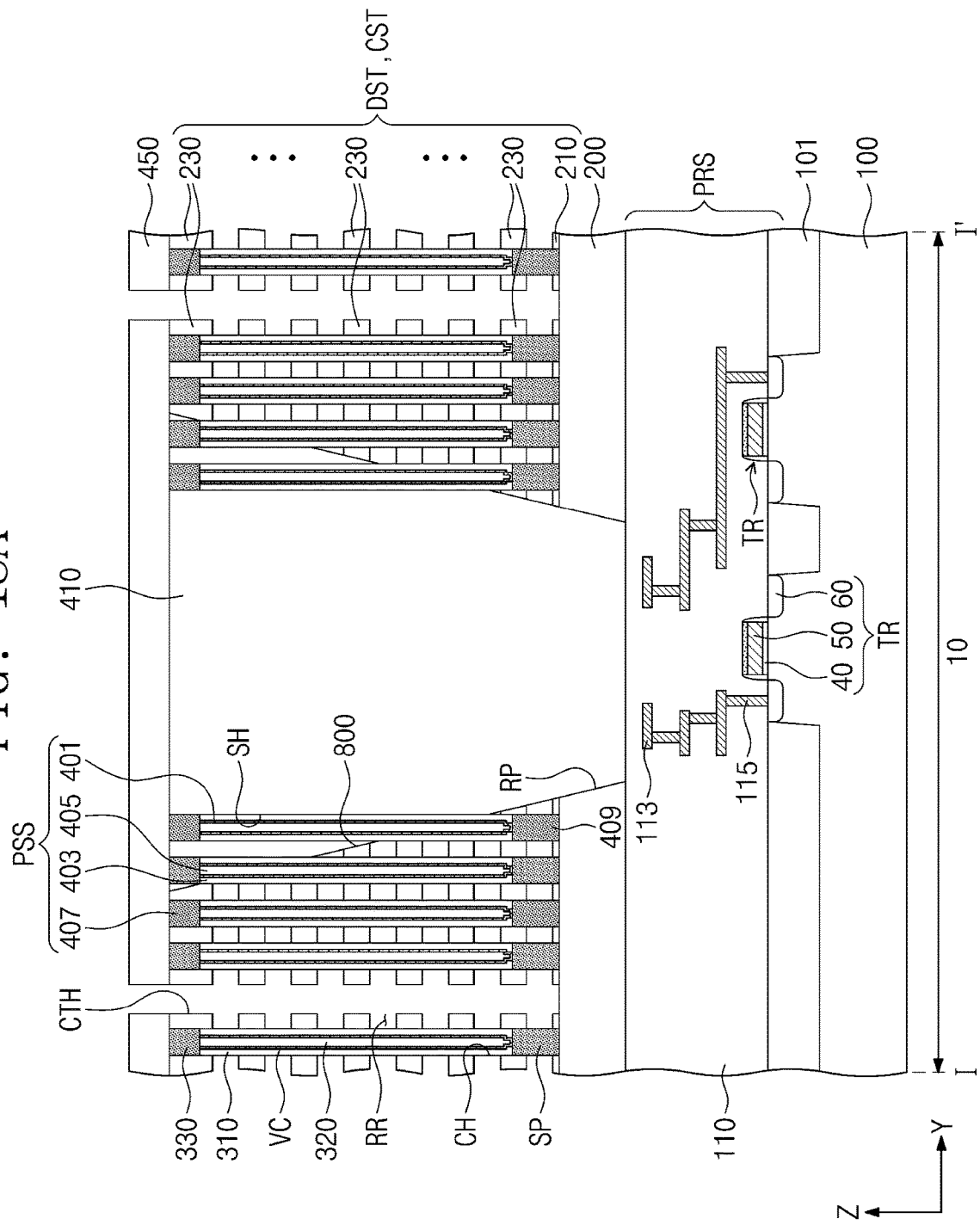
Figure 18B:
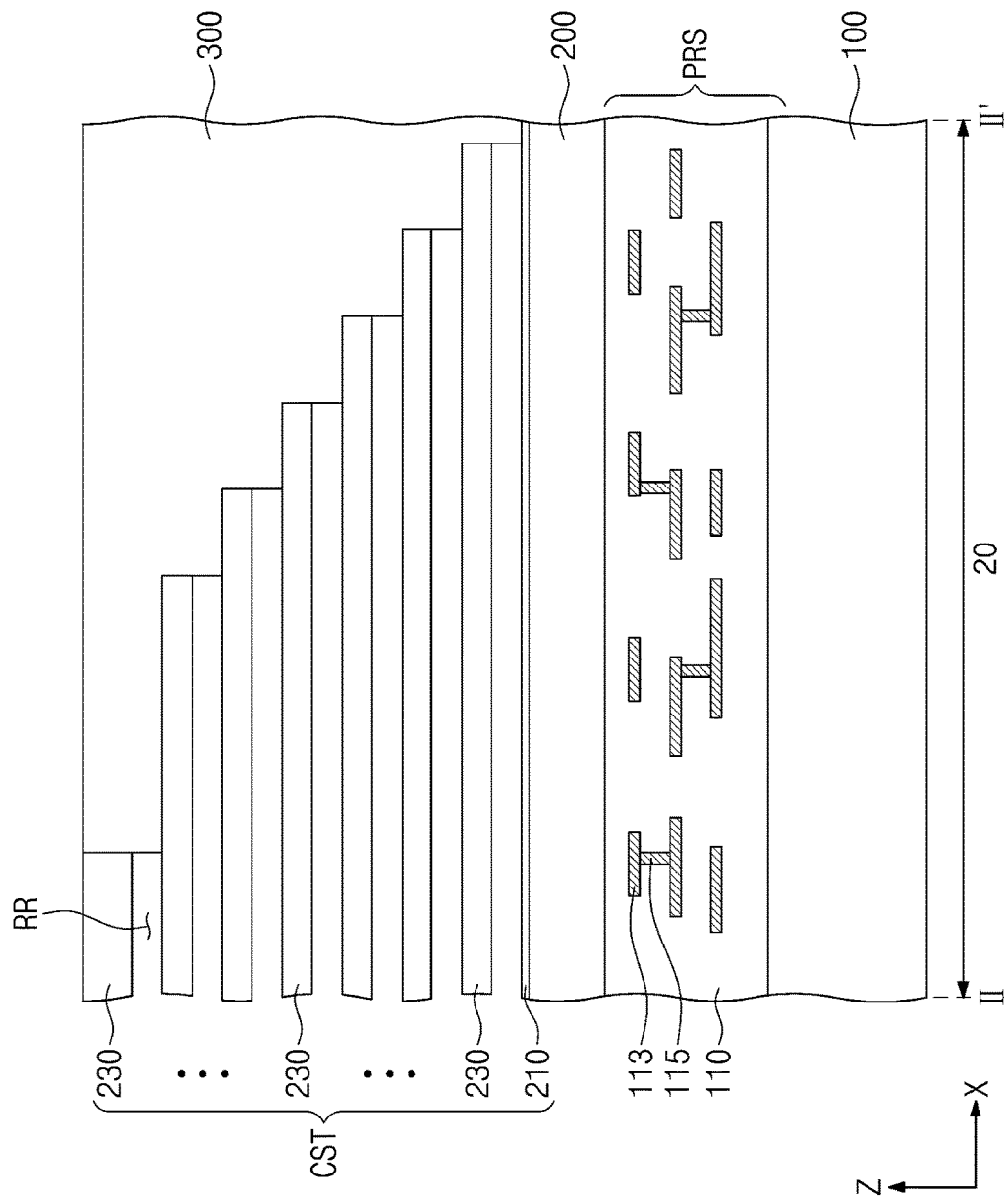

Referring to FIGS. 18A and 18B, the mold structure MS may be anisotropically etched to form a common source trench CTH. The formation of the common source trench CTH may include forming a second interlayer dielectric layer 450 on the mold structure MS, and then using the second interlayer dielectric layer 450 as an etching mask to pattern the mold structure MS and the buffer oxide layer 210 until the top surface of the second substrate 200 is exposed. The common source trench CTH may be formed to extend in the first direction X. The common source trench CTH may then have a linear or rectangular shape extending in the first direction X. The common source trench CTH may define stack structures DST and CST adjacent to each other in a second direction Y on the second substrate 200. Each of the stack structures DST and CST may include a patterned buffer oxide layer 210, insulating patterns 230, and sacrificial patterns (not shown). The stack structures DST and CST may have sidewalls exposed to the common source trench CTH.

Recess regions RR may be formed by removing the sacrificial patterns exposed to the common source trench CTH. The sacrificial patterns may be removed by a wet etching process and/or an isotropic dry etching process. The recess regions RR may be formed between the insulating patterns 230 vertically adjacent to each other and between the buffer oxide layer 210 and a lowermost one of the insulating patterns 230. The etching process may be performed using an etchant that includes phosphoric acid.

Recess regions RR may horizontally extend from the common source trench CTH into gaps between the insulating patterns 230. The recess regions RR may expose top and bottom surfaces of the insulating patterns 230, portions of outer walls of the charge storage structures 310, portions of the through dielectric pattern 410, portions of outer walls of the second vertical layers 403, and portions of the interlayer dielectric pattern 300.

According to some exemplary embodiments of inventive concepts, the vertical supporters PSS may support portions of the insulating patterns 230 of the stack structures DST and CST vertically overlapping the through dielectric pattern 410. As a result, the stack structures DST and CST may be prevented from collapse occurred around the through dielectric pattern 410.

Figure 19A:
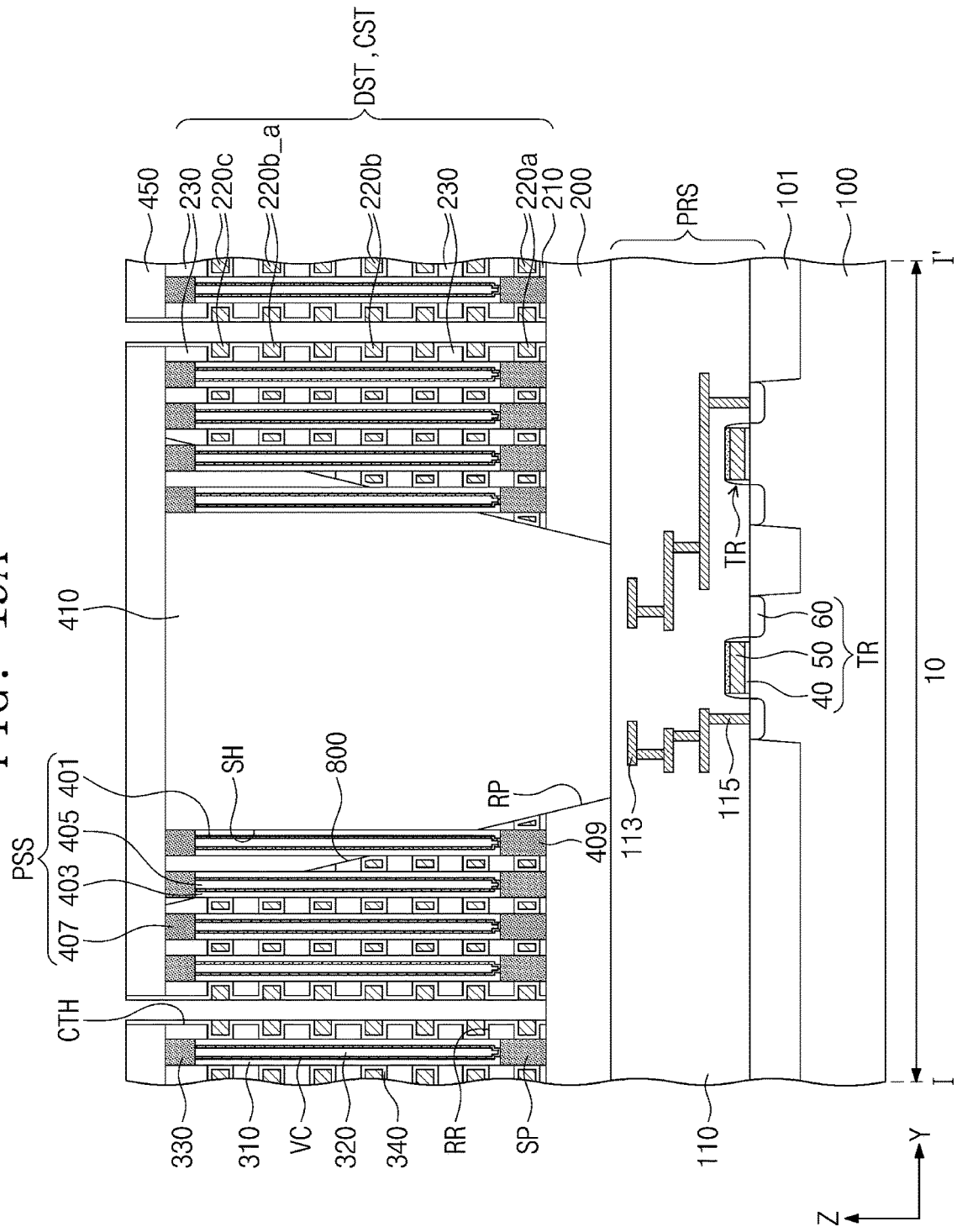
Figure 19B:
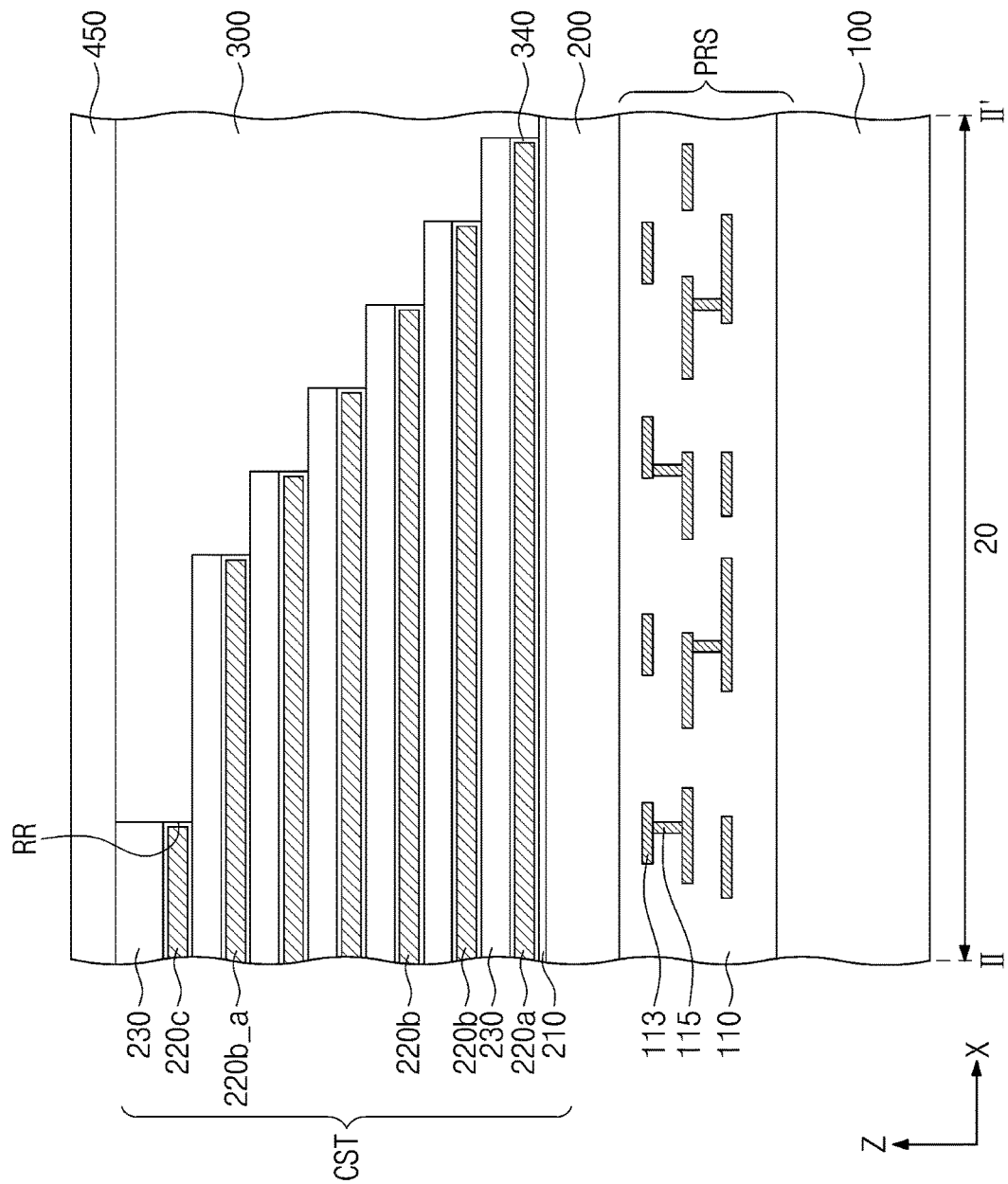

Referring to FIGS. 19A and 19B, a horizontal insulating layer 340 may be formed in the recess regions RR. For example, the horizontal insulating layer 340 may conformally cover surfaces of the insulating patterns 230, outer walls of the charge storage structures 310 exposed to the recess regions RR, outer walls of the second vertical layers 403, portions of the interlayer dielectric pattern 300, portions of the through dielectric pattern 410, and a sidewall of the second interlayer dielectric layer 450. The horizontal insulating layer 340 may be formed using a deposition process having relatively good step coverage. For example, the horizontal insulating layer 340 may be formed using chemical vapor deposition (CVD) or atomic layer deposition (ALD).

Gate electrodes 220a, 220b, 220b_a, and 220c may be locally formed in the recess regions RR. The formation of the gate electrodes 220a, 220b, 220b_a, and 220c may include forming a metal layer to fill the common source trench CTH and the recess regions RR, and then removing the metal layer from the common source trench CTH.

Common source regions CSR may be formed in the second substrate 200 exposed to the common source trench CTH. An ion implantation process may be performed to form the common source regions CSR. The common source regions CSR may have a different conductivity from that of the second substrate 200.

Figure 20:
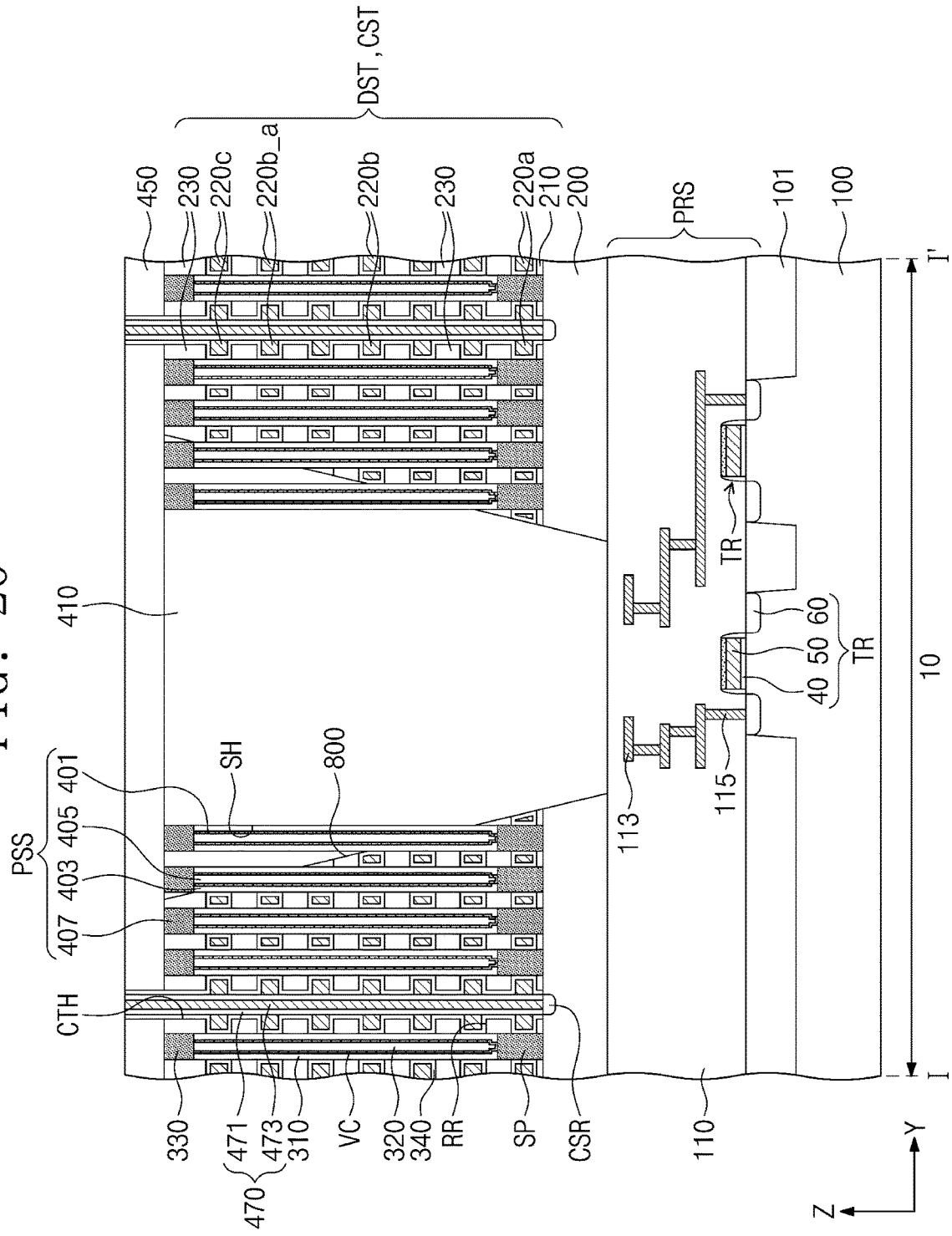

Referring to FIG. 20, a contact structure 470 may be formed in the common source trench CTH. The contact structure 470 may include a spacer 471 and a common source contact 473. The spacer 471 may cover sidewalls of the common source trench CTH. The common source contact 473 may be formed to fill a remaining space of the common source trench CTH in which the spacer 471 is formed.

Referring back to FIGS. 4 and 5, a third interlayer dielectric layer 490 may be formed on the second interlayer dielectric layer 450. The third interlayer dielectric layer 490 may cover a top surface of the contact structure 470 and a top surface of the second interlayer dielectric layer 450. The third interlayer dielectric layer 490 may include, for example, a silicon oxide layer.

Channel contact plugs CCP may be formed on the pads 330, and cell contact plugs 510 may be formed on the ends of the gate electrodes 220a, 220b, 220b_a, and 220c, which ends are disposed on the pad region 20 of the second substrate 200. Peripheral contact plugs PCP may be formed in the through dielectric pattern 410 to come into connection with the transistors TR. The channel contact plugs CCP, the cell contact plugs 510, and the peripheral contact plugs PCP may include, for example, a metal layer or a metal silicide layer.

Bit lines BL and connection lines 520 may be formed on the third interlayer dielectric layer 490. The bit lines BL may be electrically connected to the channel contact plugs CCP and the peripheral contact plug PCP, and the connection lines 520 may be electrically connected to the cell contact plugs 510.

According to some embodiments of inventive concepts, the vertical supporters may vertically extend from the top surface of the second substrate, and may be provided to penetrate the stack structure and the through dielectric pattern. When the sacrificial patterns are removed and replaced with the gate electrodes, the vertical supporters may support the insulating patterns of the stack structure that are disposed around the through dielectric pattern. As a result, the stack structures may be prevented from collapse caused by the recess regions formed when the sacrificial patterns are removed.

Although the present invention has been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts.

What is claimed is:

1. A semiconductor memory device, comprising:
a peripheral circuit structure on a first substrate;
a second substrate on the peripheral circuit structure;
a stack structure on the second substrate and comprising a plurality of gate electrodes;
a through dielectric pattern penetrating the stack structure and the second substrate, wherein the through dielectric pattern is disposed on a sloped sidewall of the stack structure; and
a vertical supporter on a top surface of the second substrate and vertically extending from the top surface of the second substrate,
wherein the vertical supporter penetrates the through dielectric pattern and further penetrates the stack structure from the sloped sidewall thereof to the top surface of the second substrate.

2. The semiconductor memory device of claim 1,
wherein the sloped sidewall of the stack structure contacts the through dielectric pattern, and
wherein the sloped sidewall is sloped at an acute or obtuse angle relative to a top surface of the first substrate.

3. The semiconductor memory device of claim 2,
wherein the second substrate has a side surface that contacts the through dielectric pattern and aligns with the sloped sidewall of the stack structure.

4. The semiconductor memory device of claim 1,
wherein the vertical supporter comprises:
a first vertical layer vertically extending from the top surface of the second substrate;
a second vertical layer surrounding the first vertical layer;
a third vertical layer filling a space surrounded by the first vertical layer; and
a capping pattern on upper portions of the first, second, and third vertical layers.

5. The semiconductor memory device of claim 4, further comprising a vertical pillar between a bottom surface of the vertical supporter and a top surface of the second substrate,
wherein the vertical pillar comprises a semiconductor material.

6. The semiconductor memory device of claim 1,
wherein a lower portion of the vertical supporter extends onto a side surface of the second substrate, the side surface contacting the through dielectric pattern, and
the vertical supporter is spaced apart from the peripheral circuit structure.

7. The semiconductor memory device of claim 1, further comprising:
a first stack structure on the stack structure and comprising a plurality of gate electrodes; and
a first through dielectric pattern vertically overlapping the through dielectric pattern and penetrating the first stack structure,
wherein the vertical supporter vertically extends and penetrates the first stack structure and the first through dielectric pattern, and
wherein the sloped sidewall of the stack structure and a sidewall of the first stack structure are misaligned with each other.

8. The semiconductor memory device of claim 1, further comprising:
a first stack structure on the stack structure and comprising a plurality of gate electrodes;
a first through dielectric pattern vertically overlapping the through dielectric pattern and penetrating the first stack structure; and
a first vertical supporter penetrating the first stack structure and the first through dielectric pattern and vertically overlapping the vertical supporter.

9. The semiconductor memory device of claim 1,
wherein the peripheral circuit structure comprises:
a transistor on the first substrate; an interlayer dielectric layer covering the transistor; and
a wiring line in the interlayer dielectric layer and connected to the transistor,
wherein the semiconductor memory device further comprises a peripheral contact plug that is spaced apart from the stack structure, penetrates the through dielectric pattern, and is disposed in the interlayer dielectric layer,
wherein the peripheral contact plug is connected to the transistor.

10. The semiconductor memory device of claim 1,
wherein the second substrate comprises a cell array region and a pad region,
wherein the semiconductor memory device further comprises a vertical channel on the cell array region of the second substrate and penetrating the stack structure,
wherein the through dielectric pattern is disposed in the cell array region, and
wherein the vertical channel is spaced apart from the through dielectric pattern.

11. The semiconductor memory device of claim 10, further comprising a bit line on the stack structure,
wherein the vertical channel is not connected to the bit line.

12. The semiconductor memory device of claim 10, further comprising a bit line on the stack structure,
wherein the vertical channel is connected to the bit line.

13. The semiconductor memory device of claim 1,
wherein the second substrate comprises a cell array region and a pad region,
wherein the semiconductor memory device further comprises:
a vertical channel on the cell array region of the second substrate and penetrating the stack structure; and
a plurality of contact plugs on the pad region of the second substrate and on ends of the gate electrodes, the ends being disposed on the pad region, wherein the through dielectric pattern is disposed in the pad region.

14. The semiconductor memory device of claim 13, wherein the gate electrodes comprise a first gate electrode and a second gate electrode sequentially stacked on the second substrate, wherein an end of the first gate electrode is exposed by the second gate electrode on the pad region of the second substrate, and wherein, when viewed in plan, the through dielectric pattern is disposed locally on the end of the first gate electrode.

15. A semiconductor memory device, comprising:
a peripheral circuit structure on a first substrate;
an interlayer dielectric layer covering the peripheral circuit structure;
a second substrate on the peripheral circuit structure and having a recess part exposing a portion of the interlayer dielectric layer covering the peripheral circuit structure;
a stack structure on the second substrate and comprising a plurality of gate electrodes;
a through dielectric pattern filling the recess part and penetrating the stack structure,
the through dielectric pattern comprising:
a first segment vertically overlapping the recess part; and
a second segment surrounding the first segment and disposed on a sidewall of the stack structure; and
a vertical supporter penetrating the second segment of the through dielectric pattern and the stack structure.

16. The semiconductor memory device of claim 15, wherein the vertical supporter is disposed on a top surface of the second substrate and vertically extends from the top surface of the second substrate and penetrates the stack structure and the through dielectric pattern.

17. The semiconductor memory device of claim 15, wherein the vertical supporter is provided in plural, the plurality of vertical supporters being arranged along the second segment spaced apart from each other in a direction parallel to a top surface of the second substrate.

18. The semiconductor memory device of claim 15, wherein the sidewall of the stack structure and a side surface of the second substrate are sloped at an acute or obtuse angle relative to a top surface of the first substrate, the sidewall and the side surface contacting the through dielectric pattern.

19. The semiconductor memory device of claim 18, wherein the sidewall of the stack structure and the side surface of the second substrate are aligned with each other.

20. A semiconductor memory device, comprising:
a peripheral circuit structure on a first substrate; a second substrate on the peripheral circuit structure and having a recess part exposing the peripheral circuit structure;
a stack structure on a top surface of the second substrate and comprising a plurality of gate electrodes; a through dielectric pattern on the recess part and covering a sidewall of the stack structure; and
a vertical supporter on a top surface of the second substrate and vertically extending from the top surface of the second substrate and penetrating the through dielectric pattern and the stack structure,
wherein the vertical supporter comprises a semiconductor material.

* * * * *